United States Patent
Najafi et al.

(10) Patent No.: US 12,009,819 B2
(45) Date of Patent: *Jun. 11, 2024

(54) SUPERCONDUCTING LOGIC COMPONENTS

(71) Applicant: PSIQUANTUM CORP., Palo Alto, CA (US)

(72) Inventors: Faraz Najafi, Palo Alto, CA (US); Qiaodan Jin Stone, Sunnyvale, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 436 days.

This patent is subject to a terminal disclaimer.

(21) Appl. No.: 17/222,657

(22) Filed: Apr. 5, 2021

(65) Prior Publication Data

US 2021/0328591 A1    Oct. 21, 2021

Related U.S. Application Data

(63) Continuation of application No. 16/473,547, filed as application No. PCT/US2019/017687 on Feb. 12, 2019, now Pat. No. 10,972,104.

(Continued)

(51) Int. Cl.
*H03K 19/195* (2006.01)
*G01J 1/44* (2006.01)
(Continued)

(52) U.S. Cl.
CPC .............. *H03K 19/195* (2013.01); *G01J 1/44* (2013.01); *H10N 60/30* (2023.02); *H10N 60/84* (2023.02); *G01J 2001/442* (2013.01)

(58) Field of Classification Search
CPC .... H03K 19/195; G01J 1/44; G01J 2001/442; G01J 1/42; H10N 60/30; H10N 60/84
See application file for complete search history.

(56) References Cited

U.S. PATENT DOCUMENTS

| | | |
|---|---|---|
| 3,059,196 A | 10/1962 | Lentz |
| 3,119,076 A | 1/1964 | Schlig et al. |

(Continued)

FOREIGN PATENT DOCUMENTS

| | | |
|---|---|---|
| CN | 106289515 A | 1/2017 |
| CN | 106549099 A | 3/2017 |

(Continued)

OTHER PUBLICATIONS

Akhlaghi et al., "Gated Mode 145:149 Superconducting Nanowire Single Photon Detectors," Optics Express, vol. 20, No. 2, Jan. 16, 2012, 9 pgs.

(Continued)

*Primary Examiner* — David P Porta
*Assistant Examiner* — Mamadou Faye
(74) *Attorney, Agent, or Firm* — Morgan, Lewis & Bockius LLP

(57) ABSTRACT

The various embodiments described herein include methods, devices, and systems for operating superconducting circuitry. In one aspect, a superconducting component includes: (1) a superconductor having a plurality of alternating narrow and wide portions, each wide portion having a corresponding terminal; and (2) a plurality of heat sources, each heat source thermally coupled to a corresponding narrow portion such that heat from the heat source is transmitted to the corresponding narrow portion; where the plurality of heat sources is electrically isolated from the superconductor.

11 Claims, 19 Drawing Sheets

Superconducting Component 100 →

Related U.S. Application Data

(60) Provisional application No. 62/660,192, filed on Apr. 19, 2018, provisional application No. 62/632,323, filed on Feb. 19, 2018, provisional application No. 62/630,657, filed on Feb. 14, 2018.

(51) Int. Cl.
 *H10N 60/30* (2023.01)
 *H10N 60/84* (2023.01)

(56) References Cited

U.S. PATENT DOCUMENTS

| | | | |
|---|---|---|---|
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,173,620 A | 12/1992 | Fujimaki et al. | |
| 5,219,826 A | 6/1993 | Kapitulnik | |
| 5,247,475 A | 9/1993 | Hasunuma et al. | |
| 5,321,004 A | 6/1994 | Perez et al. | |
| 5,365,476 A | 11/1994 | Mukhanov | |
| 5,455,519 A | 10/1995 | Ohori | |
| 5,481,119 A | 1/1996 | Higashino et al. | |
| 5,521,862 A | 5/1996 | Frazier | |
| 5,574,290 A | 11/1996 | You | |
| 5,719,105 A | 2/1998 | Odagawa et al. | |
| 5,825,240 A | 10/1998 | Geis et al. | |
| 5,831,278 A | 11/1998 | Berkowitz | |
| 5,892,644 A | 4/1999 | Evans | |
| 5,925,892 A | 7/1999 | Mizuno et al. | |
| 6,029,075 A | 2/2000 | Das et al. | |
| 6,078,517 A | 6/2000 | Herr | |
| 6,242,939 B1 | 6/2001 | Nagasawa | |
| 6,433,974 B2 | 8/2002 | Heismann | |
| 6,774,463 B1 | 8/2004 | Chaudhari et al. | |
| 7,227,438 B2 | 6/2007 | Song et al. | |
| 7,513,765 B2 | 4/2009 | Liao | |
| 7,558,030 B2 | 7/2009 | Lee et al. | |
| 7,724,083 B2 | 5/2010 | Herring et al. | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 | 11/2013 | Smith | |
| 8,736,085 B2 | 5/2014 | Sines | |
| 9,293,240 B2 | 3/2016 | Kroulik | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,876,505 B1 | 1/2018 | Dai et al. | |
| 9,998,122 B2 | 6/2018 | Hamilton et al. | |
| 10,103,736 B1 | 10/2018 | Powell et al. | |
| 10,171,086 B2 | 1/2019 | McCaughan et al. | |
| 10,177,298 B1 | 1/2019 | Taylor et al. | |
| 10,186,858 B2 | 1/2019 | Klaus et al. | |
| 10,197,440 B2 | 2/2019 | Najafi | |
| 10,361,703 B2 | 7/2019 | Najafi | |
| 10,374,611 B2 | 8/2019 | Najafi | |
| 10,386,229 B2 | 8/2019 | Najafi et al. | |
| 10,396,733 B2 | 8/2019 | Najafi et al. | |
| 10,461,445 B2 | 10/2019 | Najafi et al. | |
| 10,620,044 B2 | 4/2020 | Thompson et al. | |
| 10,972,104 B2 * | 4/2021 | Najafi | H10N 60/30 |
| 11,108,172 B2 | 8/2021 | Najafi et al. | |
| 11,133,805 B2 | 9/2021 | Najafi | |
| 11,362,664 B2 | 6/2022 | Najafi et al. | |
| 11,621,714 B2 | 4/2023 | Najafi | |
| 11,811,394 B2 | 11/2023 | Najafi et al. | |
| 2002/0149453 A1 | 10/2002 | Snitchler et al. | |
| 2005/0153843 A1 | 7/2005 | Kubota | |
| 2005/0197254 A1 | 9/2005 | Stasiak et al. | |
| 2010/0026447 A1 | 2/2010 | Keefe et al. | |
| 2010/0171098 A1 | 7/2010 | Suzuki | |
| 2011/0254053 A1 | 10/2011 | Goupil et al. | |
| 2013/0012392 A1 | 1/2013 | Tanaka et al. | |
| 2013/0143744 A1 | 6/2013 | Marsili et al. | |
| 2014/0113828 A1 | 4/2014 | Gilbert et al. | |
| 2014/0299751 A1 | 10/2014 | Tang et al. | |
| 2015/0018218 A1 | 1/2015 | Lakrimi et al. | |
| 2015/0179916 A1 | 6/2015 | Pramanik et al. | |
| 2016/0028402 A1 | 1/2016 | McCaughan et al. | |
| 2017/0186933 A1 | 6/2017 | Sunter et al. | |
| 2018/0145664 A1 | 5/2018 | Herr et al. | |
| 2019/0027672 A1 | 1/2019 | Megrant | |
| 2019/0035999 A1 | 1/2019 | Najafi | |
| 2019/0044051 A1 | 2/2019 | Caudillo et al. | |
| 2019/0109595 A1 | 4/2019 | Najafi | |
| 2019/0378874 A1 | 12/2019 | Rosenblatt et al. | |
| 2020/0176662 A1 | 6/2020 | Dayton et al. | |
| 2021/0328591 A1 | 10/2021 | Najafi et al. | |
| 2022/0231435 A1 | 7/2022 | Najafi et al. | |
| 2023/0253967 A1 | 8/2023 | Najafi | |

FOREIGN PATENT DOCUMENTS

| | | |
|---|---|---|
| DE | 2440576 B1 | 1/1976 |
| EP | 0299879 A2 | 1/1989 |
| GB | 2530500 A | 3/2016 |
| JP | S63299282 A | 12/1988 |
| JP | H0555647 A | 3/1993 |
| WO | WO90/14715 A1 | 11/1990 |
| WO | WO94/09566 A1 | 4/1994 |
| WO | WO2019071005 A1 | 4/2019 |
| WO | WO2019094957 A1 | 5/2019 |
| WO | WO2019160871 A2 | 8/2019 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.

Cheng, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosophy in Electrical Engineering, 22 pgs.

(56) References Cited

OTHER PUBLICATIONS

Murphy et al., "Nanoscale superconducting memory based on the kinetic inductance of asymmetric nanowire loops," Department of Physics, University of Illinois at Urbana-Champaign, arXiv:1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, 17 pgs.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E et al., AIN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AlN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

McCaughan, A.N., et al., "Using Geometry to Sense Current," Nano Letters 16 (2016), 6 pgs.

Saraswat et al., "Highly oriented, free-standing, superconducting NbN films growth on chemical vapor deposited graphene," APL Materials 2, 056103 (2014); https://doi.org/10.1063/1.4875356 (Year: 2014), 7 pgs.

Stanfield, CMOS-Compatible, Piezo-Optomechanically Tunable Photonics for Visible Wavelengths and Cryogenic Temperatures, vol. 27, Issue 20, pp. 28588-28605, 2019, 18 pgs.

D. Sahin et al., "Waveguide photon-number-resolving detectors for quantum photonic integrated circuits", Appl. Phys. Lett., vol. 103, No. 11, p. 111116, Sep. 2013, 16 pgs.

Sergio Pagano et al., "Nano-Strip Three-Terminal Superconducting Device for Cryogenic Detector Readout", IEEE Transactions on Applied Superconductivity, vol. 21, No. 3, Jun. 2011, 4 pgs.

PsiQuantum Corp., International Search Report and Written Opinion, PCT/US2018/033042, Aug. 28, 2018, 13 pgs.

PsiQuantum Corp., International Search Report and Written Opinion, PCT/US2018/033041, Jul. 27, 2018, 16 pgs.

PsiQuantum Corp., International Search Report and Written Opinion, PCT/US2018/044091, Nov. 7, 2018, 12 pgs.

PsiQuantum Corp., Invitation to Pay Additional Fees/Partial Search Report, PCT/US2018/037892, Aug. 20, 2018, 12 pgs.

PsiQuantum Corp., Invitation to Pay Additional Fees/Partial Search Report, PCT/US2018/054414, Jan. 24, 2019, 21 pgs.

PsiQuantum Corp., International Search Report and Written Opinion, PCT/US2018/054414, Mar. 20, 2019, 21 pgs.

Najafi, Non-Final Office Action dated Dec. 12, 2018, U.S. Appl. No. 16/028,288, 6 pgs.

Najafi, Notice of Allowance dated Apr. 5, 2019, U.S. Appl. No. 16/028,288, 10 pgs.

Najafi, Non-Final Office Action dated Sep. 21, 2018, U.S. Appl. No. 16/028,293, 8 pgs.

Najafi, Final Office Action dated Mar. 1, 2019 U.S. Appl. No. 16/028,293, 5 pgs.

Najafi, Notice of Allowance dated Sep. 21, 2018, U.S. Appl. No. 16/012,520, 9 pgs.

Najafi, Non-Final Office Action, U.S. Appl. No. 16/136,124, Apr. 4, 2019, 9 pgs.

Najafi, Quayle Office Action, U.S. Appl. No. 16/151,180, Jan. 31, 2019, 5 pgs.

Najafi, Notice of Allowace, U.S. Appl. No. 16/151,180, Mar. 14, 2019, 5 pgs.

Najafi, Notice of Allowance U.S. Appl. No. 16/151,190, Feb. 6, 2019, 11 pgs.

Najafi, Notice of Allowance U.S. Appl. No. 16/151,190, Mar. 28, 2019, 5 pgs.

Najafi, Office Action, U.S. Appl. No. 16/046,815, Feb. 4, 2019, 9 pgs.

Najafi, Office Action, U.S. Appl. No. 16/046,807, Mar. 18, 2019, 10 pgs.

Najafi, Office Action, U.S. Appl. No. 16/107,143, Mar. 19, 2019, 11 pgs.

Psiquantum, International Search Report and Written Opinion, PCT/US2019/017687, Apr. 30, 2019, 13 pgs.

Psiquantum, International Preliminary Report on Patentability, PCT/US2019/017687, Aug. 18, 2020, 6 pgs.

Psiquantum Corp., International Search Report, PCT/US2019/017691, Apr. 23, 2019, 7 pgs.

Psiquantum Corp., International Search Report and Written Opinion, PCT/US2019/030019, Jul. 17, 2019, 8 pgs.

Psiquantum Corp., PCT/US2018/044091, International Preliminary Report on Patentability, Jan. 28, 2020, 6 pgs.

Najafi, Non-Final Office Action, U.S. Appl. No. 16/664,716, Apr. 1, 2020, 15 pgs.

Psiquantum, International Search Report and Written Opinion, PCT/US2019/051853, Jan. 27, 2020, 13 pgs.

Psiquantum, International Preliminary Report on Patentability, PCT/US2018/033041, Nov. 26, 2019, 8 pgs.

Psiquantum, International Preliminary Report on Patentability, PCT/US2018/054414, Apr. 8, 2020, 15 pgs.

Najafi, Corrected Notice of Allowance, U.S. Appl. No. 16/473,550, Nov. 3, 2020, 2 pgs.

Najafi, Corrected Notice of Allowance, U.S. Appl. No. 16/553,068, Nov. 12, 2020, 2 pgs.

Najafi, Notice of Allowance, U.S. Appl. No. 16/656,506, Nov. 3, 2020, 12 pgs.

Najafi, Final Office Action, U.S. Appl. No. 16/664,716, Ot. 16, 2020, 14 pgs.

Najafi, Notice of Allowance, U.S. Appl. No. 16/543,256, Dec. 9, 2020, 12 pgs.

\* cited by examiner

SUPERCONDUCTING LOGIC COMPONENTS

CROSS REFERENCE TO RELATED APPLICATION

This application is a continuation of U.S. application Ser. No. 16/473,547, filed Jun. 25, 2019, which is a United States National Stage Application filed under 35 U.S.C. § 371 of PCT Patent Application Serial No. PCT/US2019/017687 filed on Feb. 12, 2019, which claims the benefit of and priority to U.S. patent Application No. 62/630,657 filed on Feb. 14, 2018, U.S. patent Application No. 62/632,323 filed on Feb. 19, 2018, and U.S. patent Application No. 62/660,192 filed on Apr. 19, 2018, each of which is hereby incorporated by reference in its entirety.

TECHNICAL FIELD

This relates generally to electrical circuits implementing superconducting components, including but not limited to, superconducting logic components.

BACKGROUND

Logic gates are used to implement Boolean functions and perform logical operations one or more inputs to produce an output. Thus, logic gates are essential components in many electronic devices. Superconductors are materials capable of operating in a superconducting state with zero electrical resistance under particular conditions.

SUMMARY

There is a need for systems and/or devices with more efficient and effective methods for implementing logical operations. Such systems, devices, and methods optionally complement or replace conventional systems, devices, and methods for implementing logical operations.

In one aspect, some embodiments include a superconducting component, comprising: a superconductor having a plurality of alternating narrow and wide portions, two or more of the wide portions each having a corresponding terminal; and a plurality of heat sources, each heat source thermally coupled to a corresponding narrow portion such that heat from the heat source is transmitted to the corresponding narrow portion; where the plurality of heat sources is electrically isolated from the superconductor. In some embodiments, the superconductor comprises a thin film of superconducting material. In some embodiments, the superconductor consists essentially of a thin film of superconducting material. In some embodiments, the superconducting component is configured such that in response to the transmitted heat the corresponding narrow portion transitions from a superconducting state to a non-superconducting state. In some embodiments, plurality of heat sources comprises a plurality of photon detectors.

In another aspect, some embodiments include a photon detector system including: (1) a first circuit that includes a plurality of superconducting components; (2) a resistive component coupled in parallel with the first circuit; (3) a plurality of heat sources, each heat source of the plurality of heat sources coupled to a corresponding superconducting component of the plurality of superconducting components and configured to selectively provide heat to the corresponding superconducting component in response to receiving light of at least a first intensity; (4) a current source coupled to the plurality of superconducting components and the resistive component, and configured to supply a first current, wherein the first current is adapted to bias the first circuit such that: (a) responsive to the first current, a respective superconducting component of the first circuit operates in a superconducting state; and (b) responsive to a combination of the first current and the heat from a corresponding heat source, the respective superconducting component operates in a non-superconducting state; and (5) an output component coupled to the first circuit and configured to determine a number of the plurality of superconducting components in the non-superconducting state based on an impedance of the first circuit.

In yet another aspect, some embodiments include a photon detector system including: (1) a first circuit that includes: (a) a plurality of superconducting components; and (b) a plurality of impedance components coupling the plurality of superconducting components, where the plurality of impedance components comprises one or more inductors and/or one or more resistors; (2) a plurality of heat sources, each heat source of the plurality of heat sources coupled to a corresponding superconducting component of the plurality of superconducting components and configured to selectively provide heat to the corresponding superconducting component in response to receiving light of at least a first intensity; (3) a current source coupled to the plurality of superconducting components via the plurality of impedance components and configured to supply a first current, wherein the first current is adapted to bias the first circuit such that: (i) responsive to the first current, a respective superconducting component of the first circuit operates in a superconducting state; and (ii) responsive to a combination of the first current and the heat from a corresponding heat source, the respective superconducting component operates in a non-superconducting state; and (4) an output component coupled in parallel with the first circuit, the output component configured to determine a number of the plurality of superconducting components in the non-superconducting state based on a portion of the first current flowing to the output component.

Thus, superconducting devices and systems are provided with methods for operating circuitry, thereby increasing the effectiveness, efficiency, and user satisfaction with such circuitry.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

Utilizing superconductor(s) to implement logical and readout circuit(s) enables the circuit(s) to operate at cryogenic temperatures and at nanoscale sizes. For example, such devices would be beneficial for low-latency operations directly on a cryogenic chip.

Accordingly, some embodiments include a structure comprising multiple superconducting thin-film nanowires, where each nanowire is thermally-coupled to a corresponding photon detector. In some embodiments, the structure is configured to determine how many of the photon detectors are triggered at a given time (e.g., count a number of received photons).

Figure 1A:
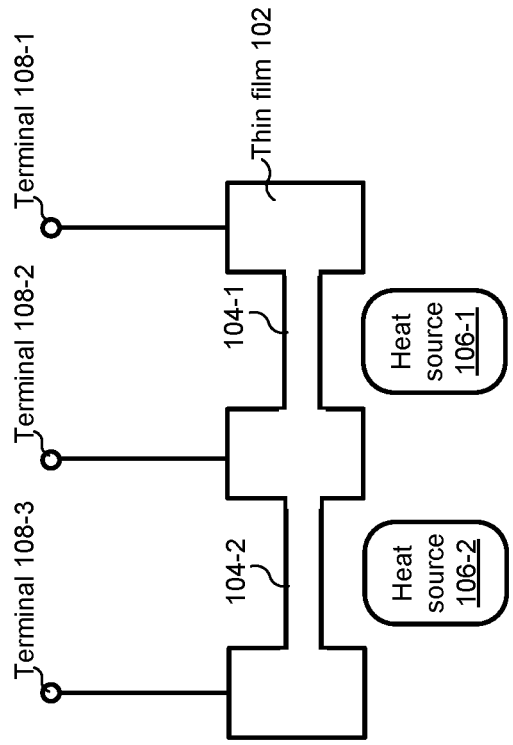
FIGS. 1A-1C are schematic diagrams illustrating representative superconducting components in accordance with some embodiments.
Figure 1B:
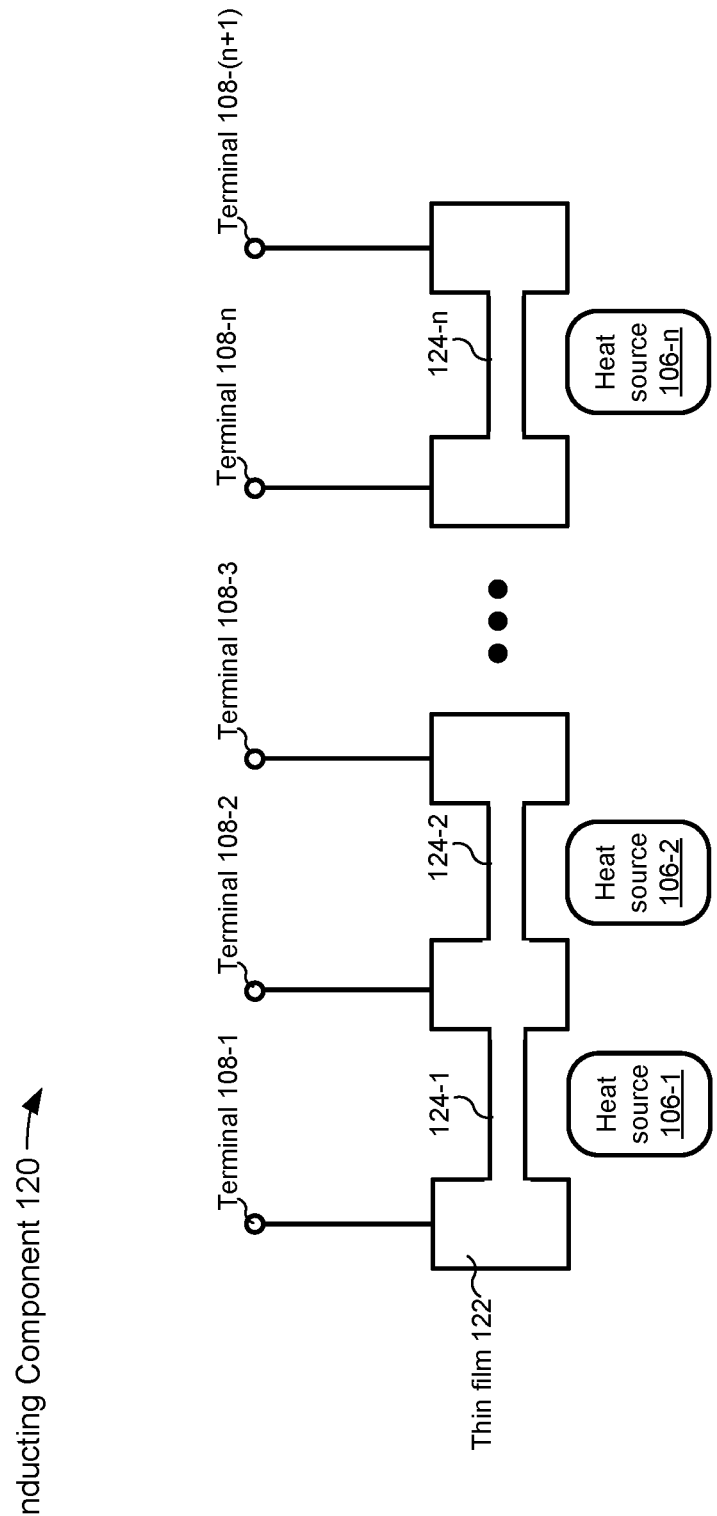
Figure 1C:
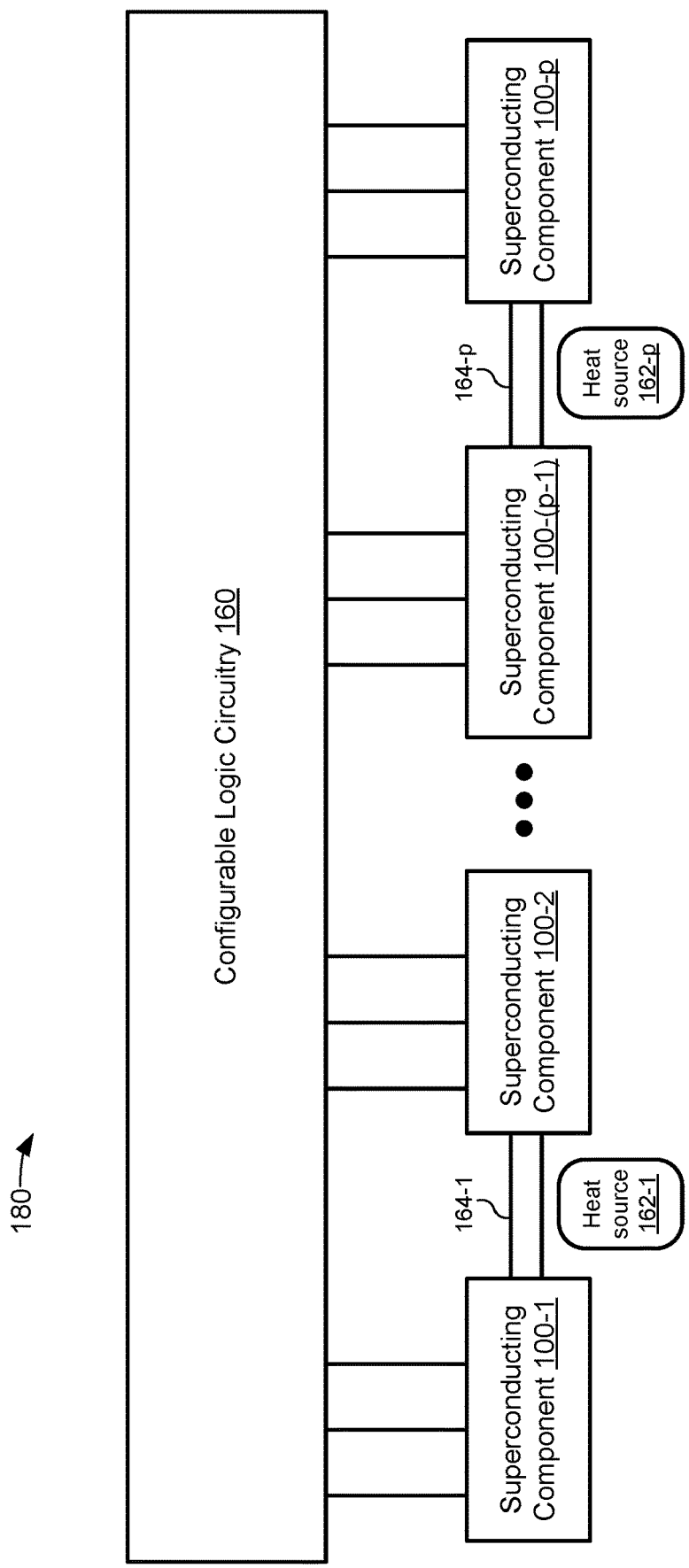

FIGS. 1A-1C are schematic diagrams illustrating representative superconducting components in accordance with some embodiments. FIG. 1A shows a superconducting component 100 including a thin film 102 having alternating narrow and wide portions, including narrow portions 104-1 and 104-2, and a terminal 108 on each wide portion (e.g., terminals 108-1, 108-2, and 108-3). In some embodiments, the thin film 102 comprises a thin film of one or more superconducting materials, such as niobium or niobium alloys). The superconducting component 100 further includes heat sources 106-1 and 106-2 thermally coupled to narrow portions 104-1 and 104-2. In some embodiments, each narrow portion 104 is thermally coupled to a corresponding heat source 106. Alternatively, in embodiments that have more than two narrow portions 104, two or more of the narrow portions 104 are thermally coupled to corresponding heat sources 106. Similarly, in some embodiments, two or more, but less than all, wide portions of the superconducting component have corresponding terminals 108 to which other circuitry or components can be electrically coupled. In some embodiments, each heat source 106 is electrically-isolated from the corresponding narrow portion 104. For example, each narrow portion 104 thermally coupled to a corresponding heat source is positioned such that heat is thermally transferred from the corresponding heat source 106 to the narrow portion 104, but no electrons transfer between the heat source 106 and the narrow portion 104 (e.g., no current flow or quantum tunneling). As another example, each narrow portion 104 thermally coupled to a corresponding heat source is positioned such that heat is thermally transferred from the corresponding heat source 106 to the narrow portion 104, but electron transfer between the heat source 106 and the narrow portion 104 is insufficient to generate a latch-up state in the heat source (e.g., the heat source is enabled to transition from the non-superconducting state back to the superconducting state regardless of the state of the narrow portion 104). In some embodiments, the thin film 102 and the heat sources 106 are patterned from a single thin film of superconducting material.

In some embodiments, the superconducting component is shaped, positioned, and biased such that, in response to transmitted heat from a heat source, a corresponding narrow portion transitions from a superconducting state to a non-superconducting state. In some embodiments, the wide portions connected to the narrow portion are of sufficient size to remain in a superconducting state while the narrow portion is in, or transitioning to, the non-superconducting state. In some embodiments, the wide portions are sized to thermally isolate the narrow portions from one another so that heat coupled to a respective narrow portion by a corresponding heat source is not sufficient (e.g., by itself) to cause a neighboring narrow portion to transition from a superconducting state to a non-superconducting state. In some embodiments, the width of each narrow portion is in the range of 150 nanometers (nm) to 1 micron. In some embodiments, the width of each wide portion is in the range of 1 micron to 100 micron. In some embodiments, the length of each narrow portion and each wide portion is in the range of 150 nm to 10 micron. In some embodiments, the ratio of the width of a narrow portion to the width of an adjacent wide portion is in the range of ½ to 1/100. In accordance with some embodiments, the wide portions are configured to function as thermal dissipaters (e.g., cooling pads) for adjacent narrow sections. In some embodiments, the wide portions prevent hot areas in some narrow portions (due to heat from the heat sources) from spreading into the other narrow portions.

FIG. 1B shows a superconducting component 120 similar to the superconducting component 100 of FIG. 1A except that the component 120 includes 'n' narrow portions 124, 'n' heat sources 106, and 'n'+1 terminals 108. In various embodiments, 'n' ranges from 3 to 100 or more. In some embodiments, each terminal 108 is configured to be coupled to an input and/or output of the superconducting component 100 (e.g., as shown and described with respect to FIGS. 3A and 5A). In some embodiments, the thin film 122 is composed of niobium and/or a niobium alloy.

In some embodiments, the superconducting components 100 and 120 are configured for use as building blocks in larger circuits. In some embodiments, one or more of the superconducting components 100 and/or superconducting components 120 are coupled to one or more additional components (e.g., to form one or more logic gates and/or readout circuits). In some embodiments, one or more of the superconducting components 100 and/or superconducting components 120 are coupled to additional circuitry so as to operate as a superconducting field programmable gate array (FPGA).

FIG. 1C is a schematic diagram illustrating a circuit or system 180 having 'p' superconducting components 100 coupled together via a plurality of superconducting sections 164. In some embodiments, each superconducting section 164 is sized similar to a narrow portion 104 (e.g., is narrower than a wide portion of the thin film 102). In accordance with some embodiments, each superconducting section 164 is thermally coupled to a corresponding heat source 106. In various embodiments, 'p' ranges from 4 to 100 or more. In FIG. 1C, the superconducting components 100 are coupled (e.g., via the terminals 108) to configurable logic circuitry 160 in accordance with some embodiments. In some embodiments, the heat sources 162 are the same as heat sources 106. In some embodiments, the heat sources 106 and 162 comprise circuits that generate heat in response to inputs (e.g., photon inputs and/or electrical inputs). In some embodiments, circuit or system 180 includes additional superconducting components and/or non-superconducting circuits, not shown, that are different configured from the superconducting components shown in FIGS. 1A-1C, in order to provide additional logic, computational and/or signal processing functions.

As used herein, a "superconducting circuit" or "superconductor circuit" is a circuit having one or more superconducting materials. For example, a superconducting logic circuit is a logic circuit that includes one or more superconducting materials. As used herein, a "superconducting" material is a material that is capable of operating in a superconducting state (under particular conditions). For example, a material that operates as a superconductor (e.g., operates with zero electrical resistance) when cooled below a particular temperature (e.g., a critical temperature) and having less than a maximum current flowing through it. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance. As an example, superconducting film 102 is a superconducting material that is capable of operating in a superconducting state (e.g., under particular operating conditions).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a threshold temperature). A cross-section of a wire (e.g., a cross-section that is perpendicular to a length of the wire) optionally has a geometric (e.g., flat or round) shape or a non-geometric shape. In some embodiments, a length of a wire is greater than a width or a thickness of the wire (e.g., the length of a wire is at least 5, 6, 7, 8, 9, or 10 times greater than the width and the thickness of the wire).

Figure 2A:
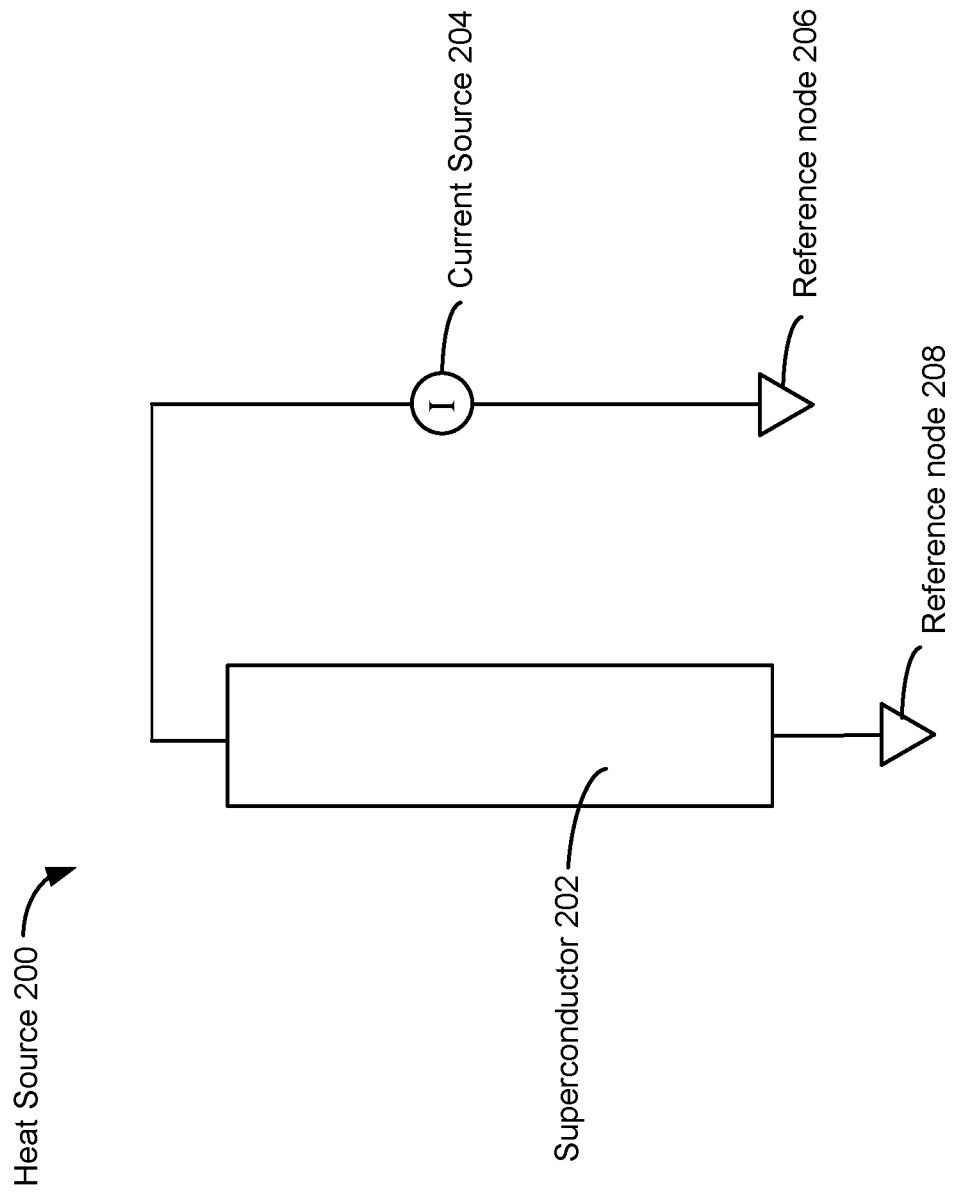
FIG. 2A is a schematic diagram illustrating a representative heat source in accordance with some embodiments.

FIG. 2A is a schematic diagram illustrating a heat source 200 in accordance with some embodiments. The heat source 200 in FIG. 2A includes a superconductor 202 coupled to a current source 204. The superconductor 202 is also coupled to a reference node 208 and the reference node 206 via the current source 204. In some embodiments, the current source 204 is configured to provide a current such that the superconductor 202 operates in a superconducting state. In some embodiments, the current source 204 is configured to provide a current such that the superconductor 202 transitions from the superconducting state to a non-superconducting state in response to one or more incident photons, for example, in response to receiving light of at least a first intensity.

In some embodiments, the superconductor 202 is positioned in proximity to a narrow superconducting portion (e.g., narrow portion 104, narrow portion 124, or superconducting section 164. In some embodiments, as a result of such proximity, heat source 200 is thermally coupled to and electrically isolated from a corresponding narrow superconducting portion, such as narrow portion 104, 124 or 164. In some embodiments, one or more of the heat sources 106 and/or the heat sources 162 comprise heat source 200.

In some embodiments, one or more of the heat sources 106 and/or the heat sources 162 is a photon detector circuit, such as a pump-gated superconducting photon detector.

In some embodiments, one or more of the heat sources 106 and/or the heat sources 162 comprises another type of heat source. For example, a type of heat source utilizing a semiconductor to generate heat (e.g., via resistive heat). In some embodiments, one or more of the narrow portions 104, narrow portions 124, or superconducting sections 164 is coupled to a constant heat source. For example, a constant heat source configured to provide a constant source of heat sufficient to transition the narrow portion from a superconducting state to a non-superconducting state. As another example, a constant heat source configured to provide no heat or a constant source of heat insufficient to transition the narrow portion from a superconducting state to a non-superconducting state.

Figure 2B:
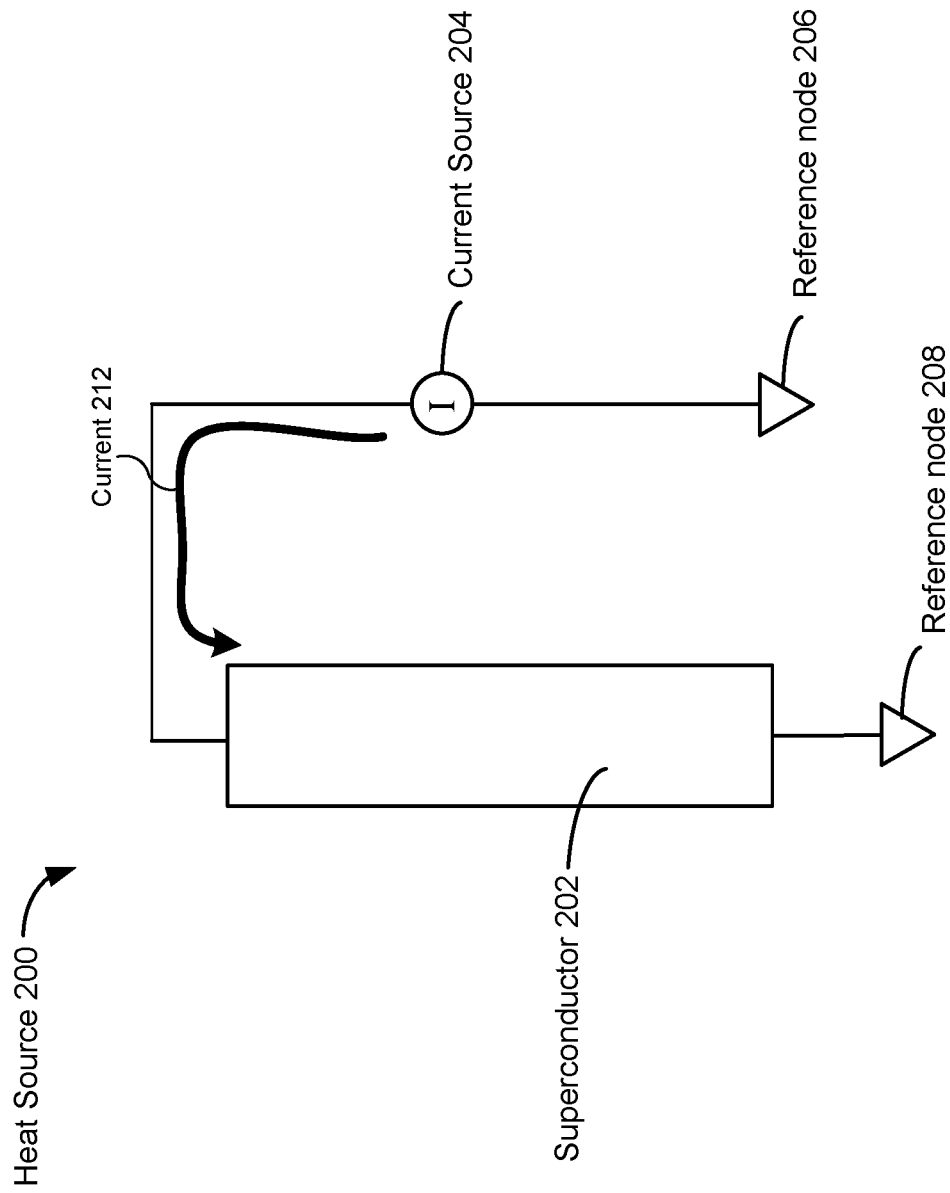
FIGS. 2B-2D are prophetic diagrams illustrating a representative operating sequence of the heat source of FIG. 2A in accordance with some embodiments.
Figure 2C:
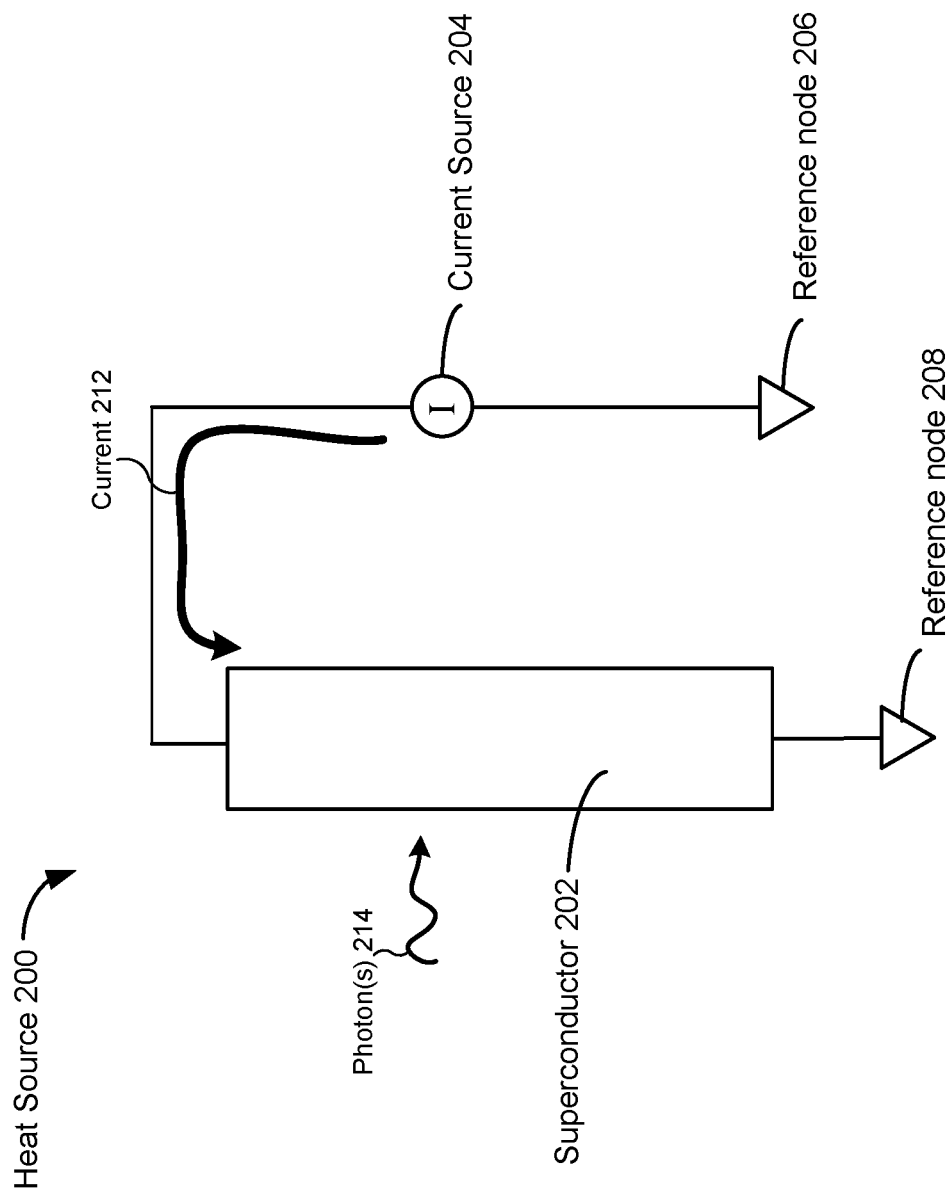
Figure 2D:
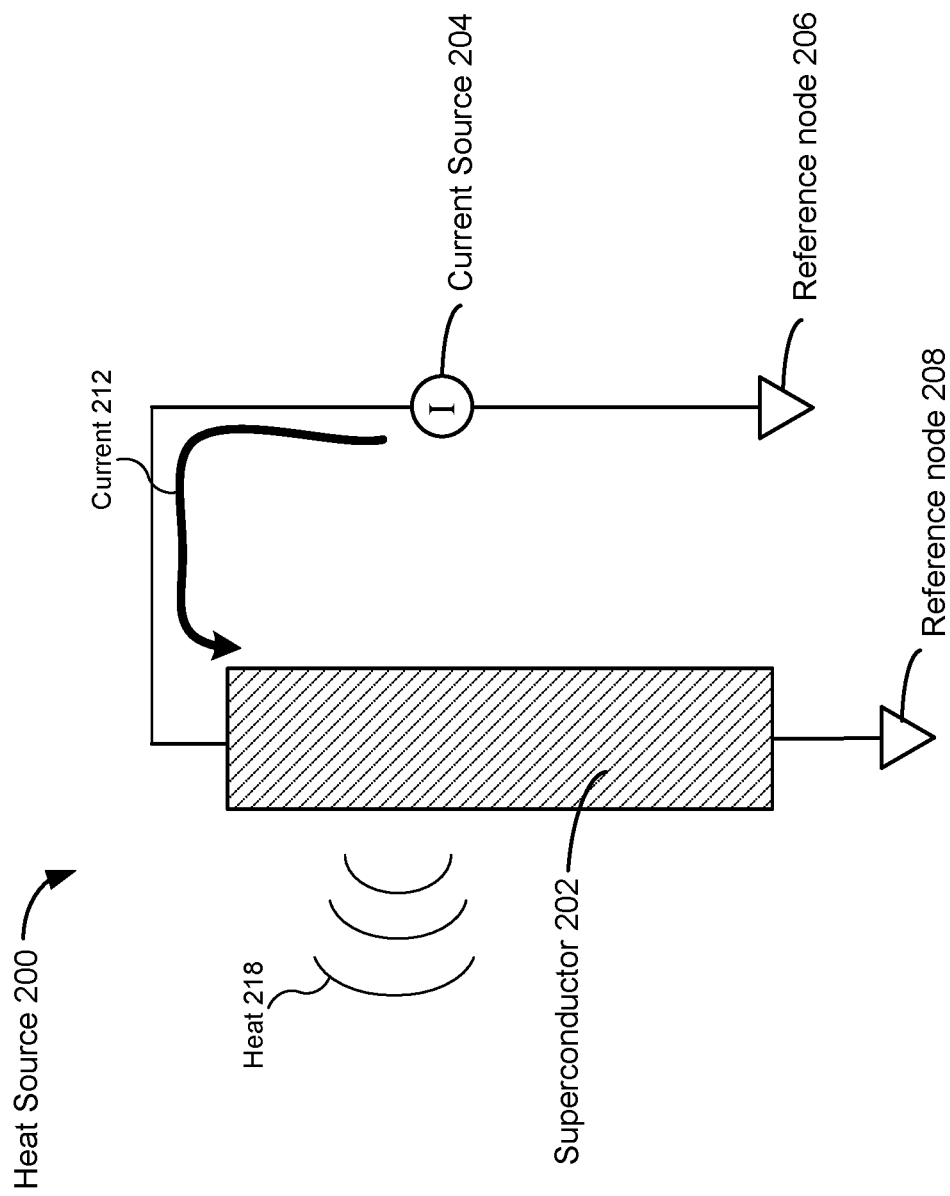

FIGS. 2B-2D are prophetic diagrams illustrating a representative operating sequence of the heat source 200 going active, from an inactive state to an active state, in accordance with some embodiments (e.g., in response to the heat source receiving light of at least a first intensity). FIG. 2B shows the current source 204 supplying a current 212 to the superconductor 202. In accordance with some embodiments, the current 212 is adapted such that the superconductor 202 operates in the superconducting state while the current 212 is supplied (e.g., the current 212 does not exceed a superconducting current threshold of the superconductor 202). As a result, the heat source 200 is in the inactive state. FIG. 2C shows one or more photons 214 impacting the superconductor 202 while the current 212 is supplied. In accordance with some embodiments, the superconductor 202 and the current 212 are configured such that receipt of the photon(s) 214 (e.g., receiving light of at least a first predefined intensity) causes superconductor 202 to transition to the non-superconducting state, as illustrated in FIG. 2D. As a result, the heat source 200 transitions to the active state, sometimes called going active. For example, the superconductor 202 and the current 212 are configured such that receipt of the photon(s) 214 lowers the superconducting current threshold of the superconductor 202 (e.g., by breaking cooper pairs) so that he current 212 exceeds the lowered threshold, thereby transitioning the superconductor 202 from the superconducting state to the non-superconducting state. FIG. 2D shows the superconductor 202 in the non-superconducting state (e.g., as illustrated by the striped patterning) in response to the current 212 and the photon(s) 214. FIG. 2D also shows the superconductor 202 generating heat 218 (e.g. resistive heat) as the current 212 flows through the superconductor 202 in the non-superconducting state. In some embodiments, the heat 218 comprises the heat generated by a heat source 106 or 162. In some embodiments, the heat source 200 is positioned such that the heat 218 is transferred to a narrow portion 104. In some embodiments, the heat source 200 is configured such that the heat 218 is sufficient to transition a narrow portion 104 of the thin film 102 from the superconducting state to the non-superconducting state.

By electrically isolating the photon detector circuits as heat source inputs to a superconducting readout circuit (e.g., the circuits shown in FIGS. 3A-3B and 5A-5B), the photon detector circuits are more accurate and stable. For example, there is no current flow from the readout circuit into the photon detector circuits to produce false positives or otherwise disrupt the functionality of the photon detector circuits. As another example, the photon detector circuits are electrically-isolated from one another to prevent them from influencing one another (e.g., and producing false positives). Moreover, the photon detector circuits are enabled to be reset quickly (e.g., no latching) after a photon trigger while the readout circuitry may be configured to hold the detection longer, e.g., the corresponding narrow portion of the thin film is optionally maintained in the non-superconducting state for an extended time. For example, the narrow portion of the thin film is maintained in the non-superconducting state until the circuit is reset (e.g., by ceasing to supply a current to the thin film). This enables the counting of photons that are staggered in time (e.g., photons that occur or are received at different times) using discrete photon detector circuits.

Figure 3A:
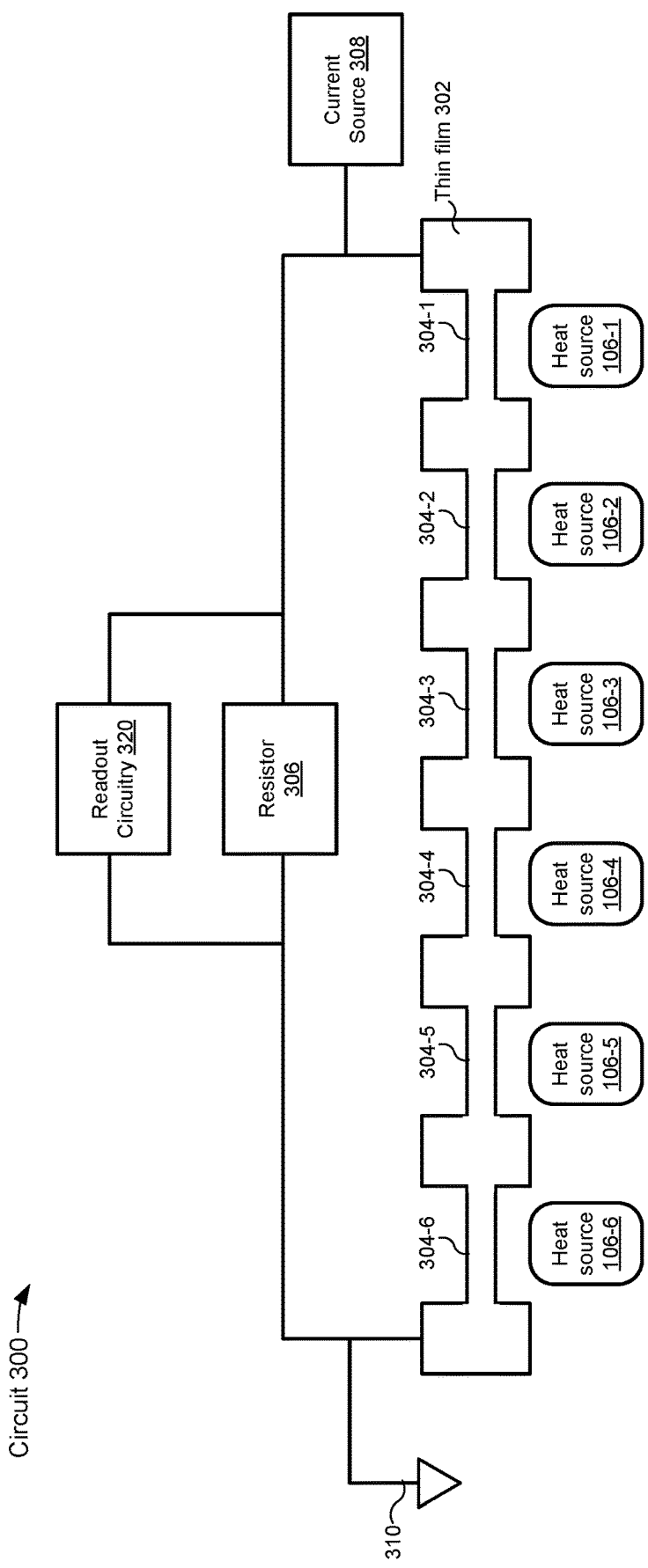
FIGS. 3A-3B are schematic diagrams illustrating representative superconducting circuits in accordance with some embodiments.
Figure 3B:
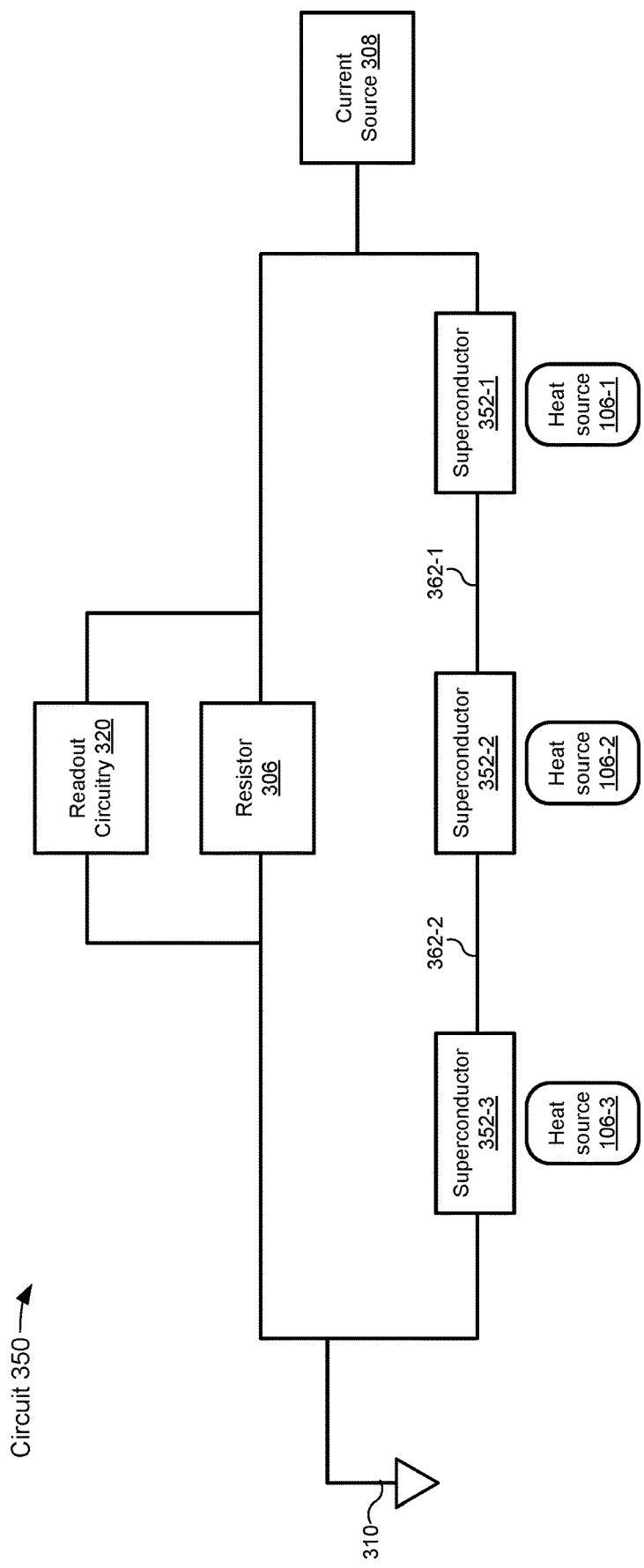

FIGS. 3A-3B are schematic diagrams illustrating representative superconducting circuits in accordance with some embodiments. FIG. 3A illustrates a superconducting circuit 300 including a plurality of heat sources 106 and a thin film 302 having alternating narrow portions 304 and wide portions (e.g., "n" narrow portions and "n+1" wide portions, where, in various embodiments, "n" is equal to at least 2, at least 3, at least 4, at least 6, or at least 8). Although FIG. 3A shows the thin film 302 with 6 narrow portions and 7 wide portions, in various embodiments the number of narrow portions varies from 2 to 100. In some embodiments, the thin film 302 and heat sources 106 comprise the superconducting component 120 (FIG. 1B). FIG. 3A further shows a current source 306 coupled to a first end of the thin film 302, a reference node 310 (e.g., an electrical ground) coupled to a second end of the thin film 302, and a resistor 306 and readout circuitry 320 coupled in parallel with the thin film 302. In some embodiments, one or more additional components are coupled to the thin film 302 (e.g., one or more inductors are coupled in series with the thin film 302 and/or the resistor 306). Each narrow portion 304 in FIG. 3A is thermally coupled and electrically isolated from a corresponding heat source 106. In some embodiments, two or more, but less than all, of the narrow portions 304 are thermally coupled and electrically isolated from a corresponding heat source 106. In some embodiments, the resistor 306 has a resistance value in the range of 100 kiloohms to 10 megaohms. In some embodiments, the readout circuitry 320 is configured to measure an amount of current received from the current source 308 (e.g., to determine how many heat sources went active).

FIG. 3B illustrates a superconducting circuit 350 similar to the superconducting circuit 300 except that the thin film 302 in FIG. 3A is replaced with a plurality of discrete superconductors 352. In FIG. 3B, the superconductors 352 are coupled in series via a plurality of semiconductor wires 362 in accordance with some embodiments. In some embodiments, (not shown) the superconductors 352 are coupled in series via a plurality of superconducting wires. Although FIG. 3B shows the circuit 350 with 3 superconductors 352, in various embodiments the number of superconductors 352 varies from 2 to 100.

Figure 4A:
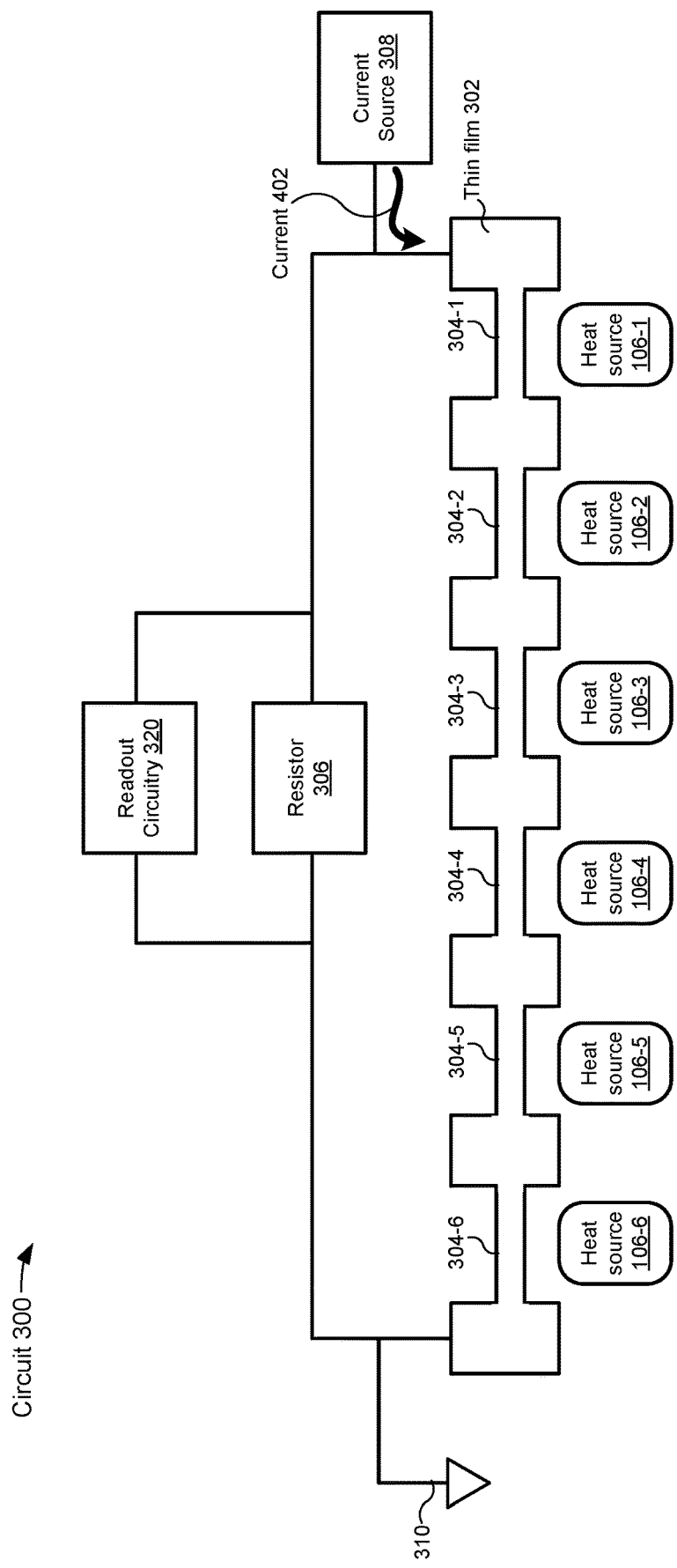
FIGS. 4A-4C are prophetic diagrams illustrating a representative operating sequence of the superconducting circuit of FIG. 3A in accordance with some embodiments.
Figure 4B:
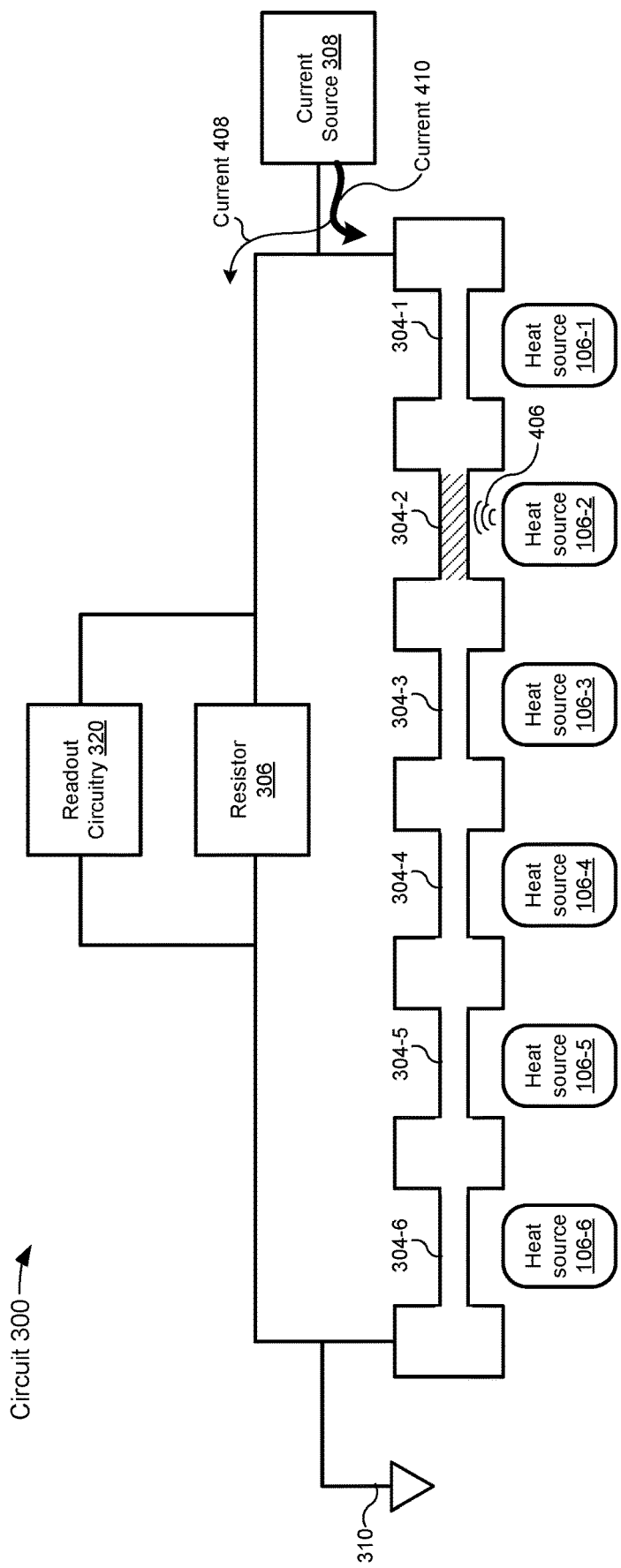
Figure 4C:
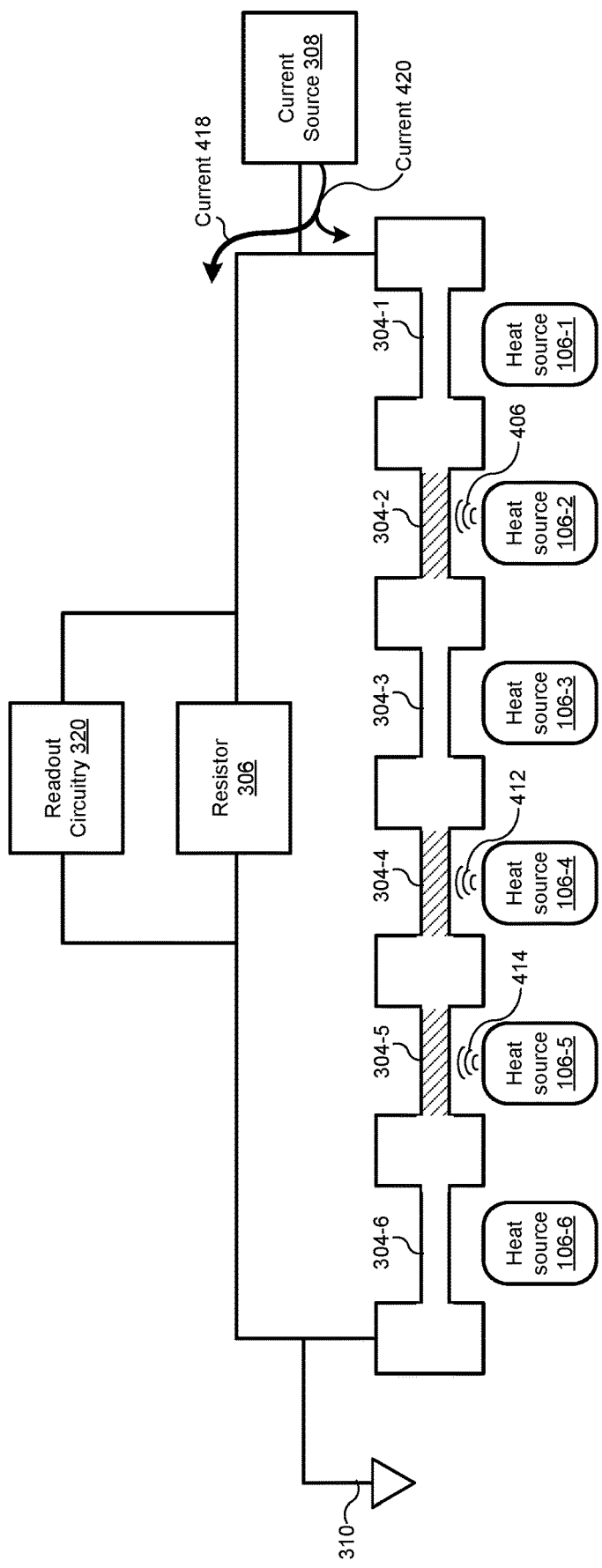

FIGS. 4A-4C are prophetic diagrams illustrating a representative operating sequence of the superconducting circuit 300 in accordance with some embodiments. In FIG. 4A, the current source 308 is supplying a current 402 adapted such that each narrow portion 304 of the thin film 302 is operating in the superconducting state (e.g., the current 402 is less than a superconducting threshold current for each of the narrow portions 304). Since the thin film 302 has zero resistance while in the superconducting state, the current 402 flows through the thin film 302 rather than the resistor 306 in FIG. 4A. In some embodiments, the current 402 is in the range of 10 milliamps to 100 milliamps.

In FIG. 4B the heat source 106-2 is actively transferring heat 406 to the corresponding narrow portion 304-2 of the thin film 302. The heat 406 lowers the superconducting current threshold of the narrow portion 304-2 such that the current 402 exceeds the lowered threshold. As a result of the current 402 exceeding the lowered threshold, the narrow portion 304-2 of the thin film 302 transitions from the superconducting state to the non-superconducting state. The narrow portion 304-2 has non-zero resistance while in the non-superconducting state. The non-zero resistance of the narrow portion 304-2 results in a portion 408 of the current from the current source 308 redirecting to the resistor 306, and a current 410, less than the current 402, flowing through the thin film 302. The impedance of the thin film 302 corresponds to (e.g., is proportional to) the number of narrow portions in the non-superconducting state. In the example of FIG. 4B, the amount of the current 408 indicates that one narrow portion is in the non-superconducting state.

In FIG. 4C the heat sources 106-2, 106-4, and 106-5 are actively transferring heat 406, 412, and 414, respectively, to the corresponding narrow portions 304-2, 304-4, and 304-5 of the thin film 302. The transferred heat 406, 412, and 414 lowers the superconducting current threshold of the corresponding narrow portions such that the current 402 exceeds the lowered threshold. As a result of the current 402 exceeding the lowered thresholds, the narrow portions 304-2, 304-4, and 304-5 of the thin film 302 transition from the superconducting state to the non-superconducting state. The non-zero impedance of the narrow portions 304-2, 304-4, and 304-5 result in a portion 418 of the current (greater than the portion 408 in FIG. 4B) from the current source 308 redirecting to the resistor 306, and a current 420, less than the current 402, flowing through the thin film 302. In the example of FIG. 4C, the amount of the current 418 indicates that three narrow portions are in the non-superconducting state.

In some embodiments, (not shown) the resistor 306 is not present in the superconducting circuit 300 and the impedance of the thin film 302 is measured to determine a number of narrow portions in the non-superconducting state.

Figure 5A:
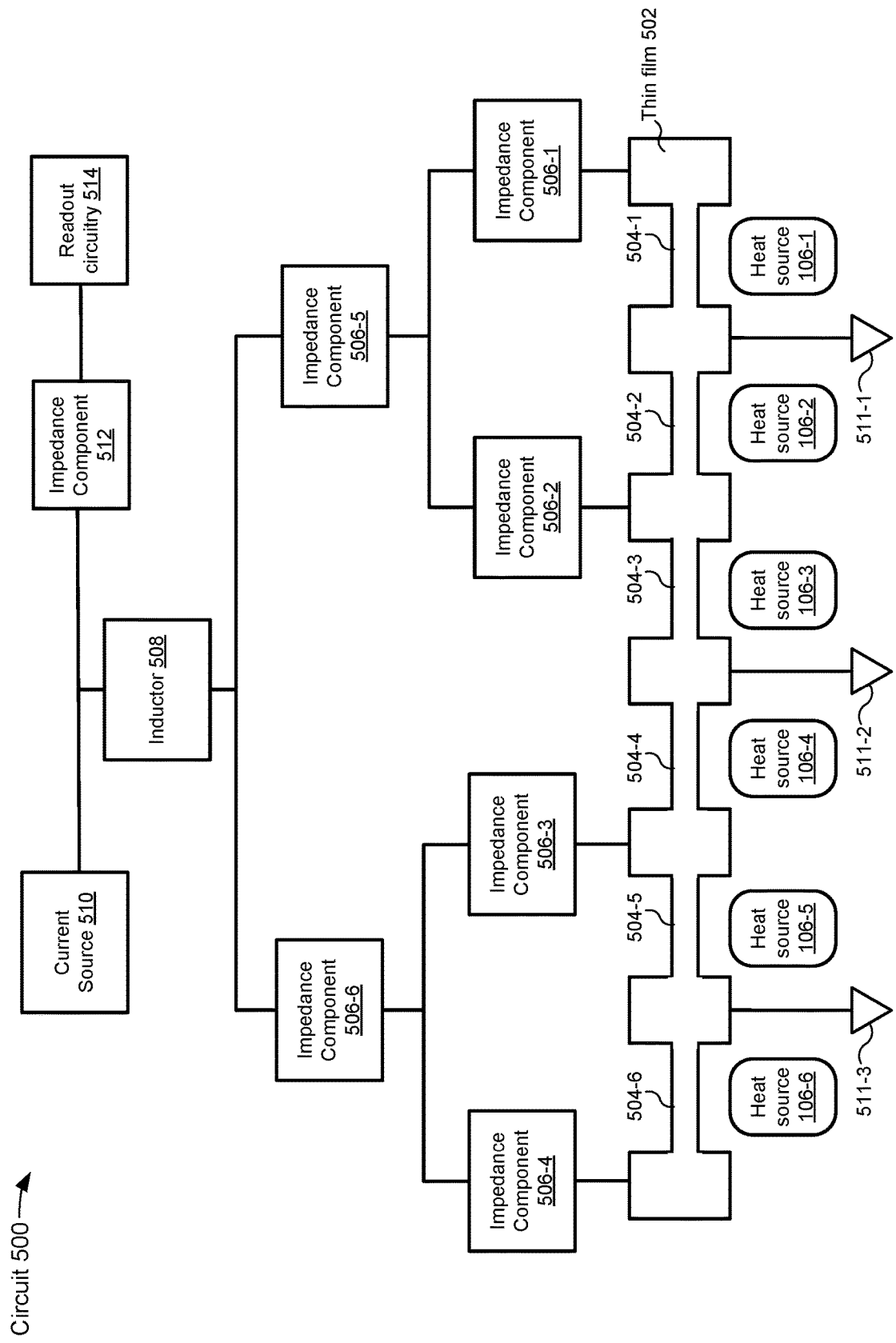
FIGS. 5A-5B are schematic diagrams illustrating representative superconducting circuits in accordance with some embodiments.
Figure 5B:
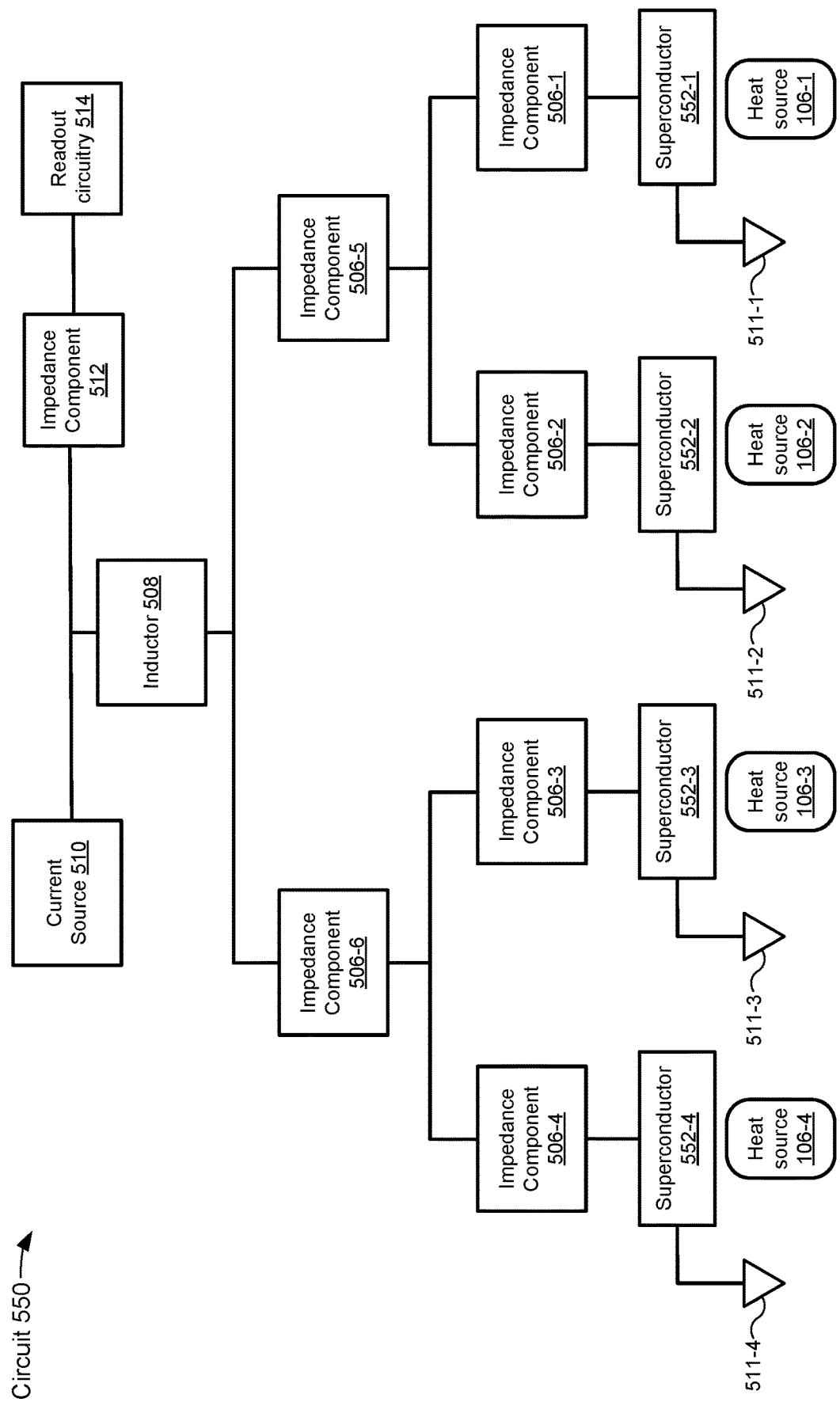

FIGS. 5A-5B are schematic diagrams illustrating representative superconducting circuits in accordance with some embodiments. FIG. 5A illustrates a superconducting circuit 500 including a plurality of heat sources 106 and a thin film 502 having alternating narrow portions 504 and wide portions (e.g., "n" narrow portions and "n+1" wide portions, where, in various embodiments, "n" is equal to at least 2, at least 3, at least 4, at least 6, or at least 8). Although FIG. 5A shows the thin film 302 with 6 narrow portions and 7 wide portions, in various embodiments the number of narrow portions varies from 2 to 100. In some embodiments, the thin film 502 and heat sources 106 comprise the superconducting component 120 (FIG. 1B).

FIG. 5A further shows a current source 510 coupled to wide portions of the thin film 502 and reference nodes 511 (e.g., an electrical ground) coupled to the remainder of the wide portions of the thin film 502 such that the wide portions are alternatively coupled to the current source 510 and a reference node 511. Each narrow portion 504 in FIG. 5A is thermally coupled to and electrically isolated from a corresponding heat source 106. The thin film 502 in FIG. 5A is coupled to the current source 510 via a plurality of impedance components 506 (e.g., resistors and/or inductors) and an inductor 508. The thin film 502 is also coupled to readout circuitry 514 via the impedance components 506, inductor 508, and an impedance component 512. In some embodiments, each impedance component 506 comprises a resistive element and/or an inductive element. In some embodiments, the impedance components 506 each have a resistance value between 0 ohms and 500 ohms. In some embodiments, the impedance components 506 each have an inductance value between 0 henry and 100 nanohenry. In some embodiments, the current source 510 is configured to supply a current in the range of 10 milliamps to 100 milliamps. In some embodiments, the current source 510 is configured to supply a current adapted such that the thin film 502 operates in the superconducting state, absent any heat from the heat sources 106. Although FIG. 5A shows the thin film 502 with 6 narrow portions, in various embodiments the number of narrow portions varies from 2 to 100. In some embodiments, the impedance components 506 and connecting wires comprise superconducting elements, while in other embodiments, the impedance components 506 and connecting wires comprise semiconducting elements. In some embodiments, the readout circuitry 514 is configured to measure an amount of current received from the current source 510 (e.g., to determine how many heat sources went active).

FIG. 5B illustrates a superconducting circuit 550 similar to the superconducting circuit 500 except that the thin film 502 in FIG. 5A is replaced with a plurality of discrete superconductors 552. In FIG. 5B, the superconductors 552 are coupled in parallel to the current source 510 and the readout circuitry 514. In various embodiments, the superconductors 552 are coupled to the current source 510 and/or the readout circuitry 514 via one or more superconducting wires and/or one or more semiconducting wires. Although FIG. 5B shows the circuit 550 with 4 superconductors 552, in various embodiments the number of superconductors 552 varies from 2 to 100.

Figure 6A:
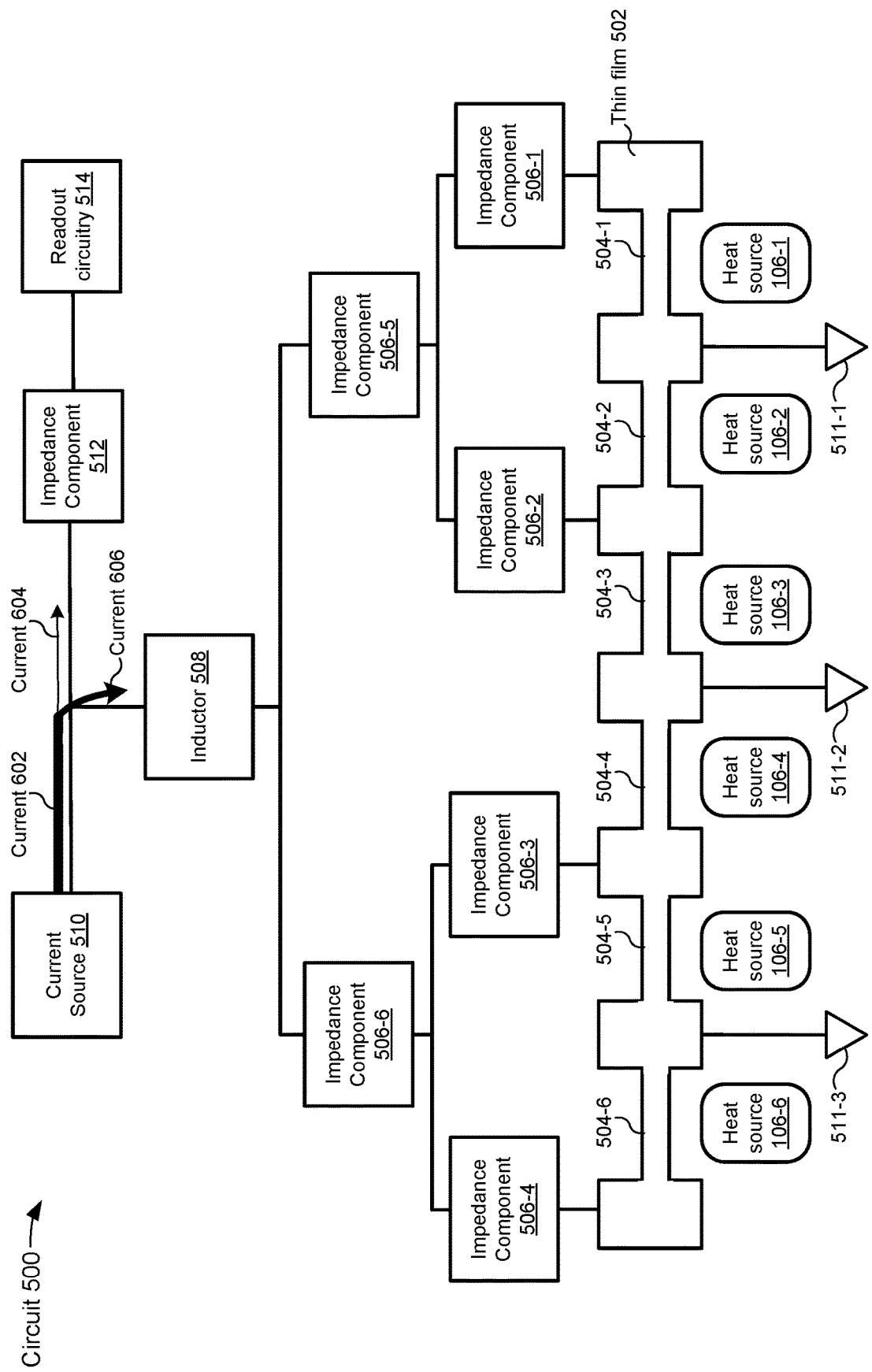
FIGS. 6A-6C are prophetic diagrams illustrating a representative operating sequence of the superconducting circuit of FIG. 5A in accordance with some embodiments.
Figure 6B:
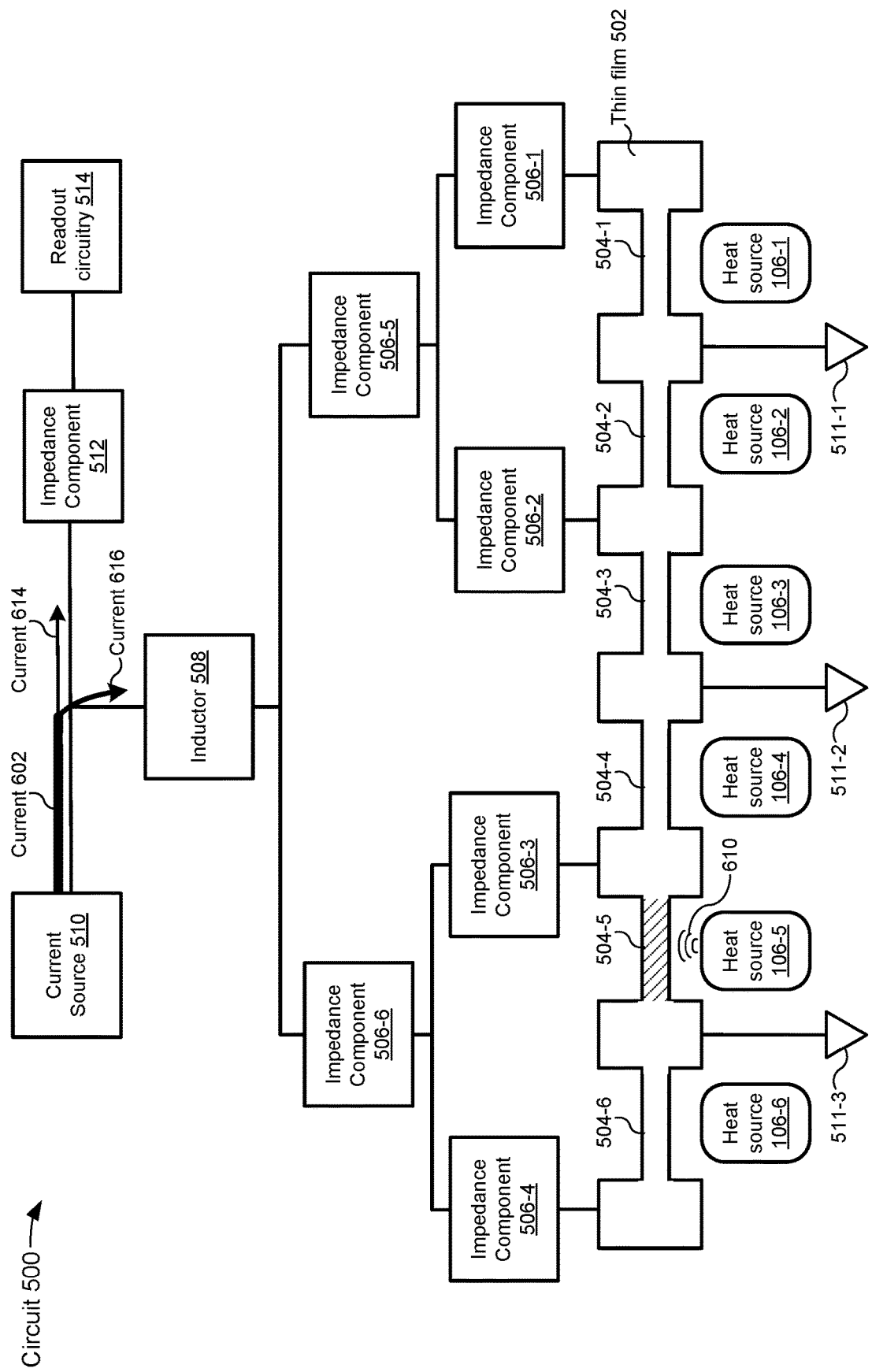
Figure 6C:
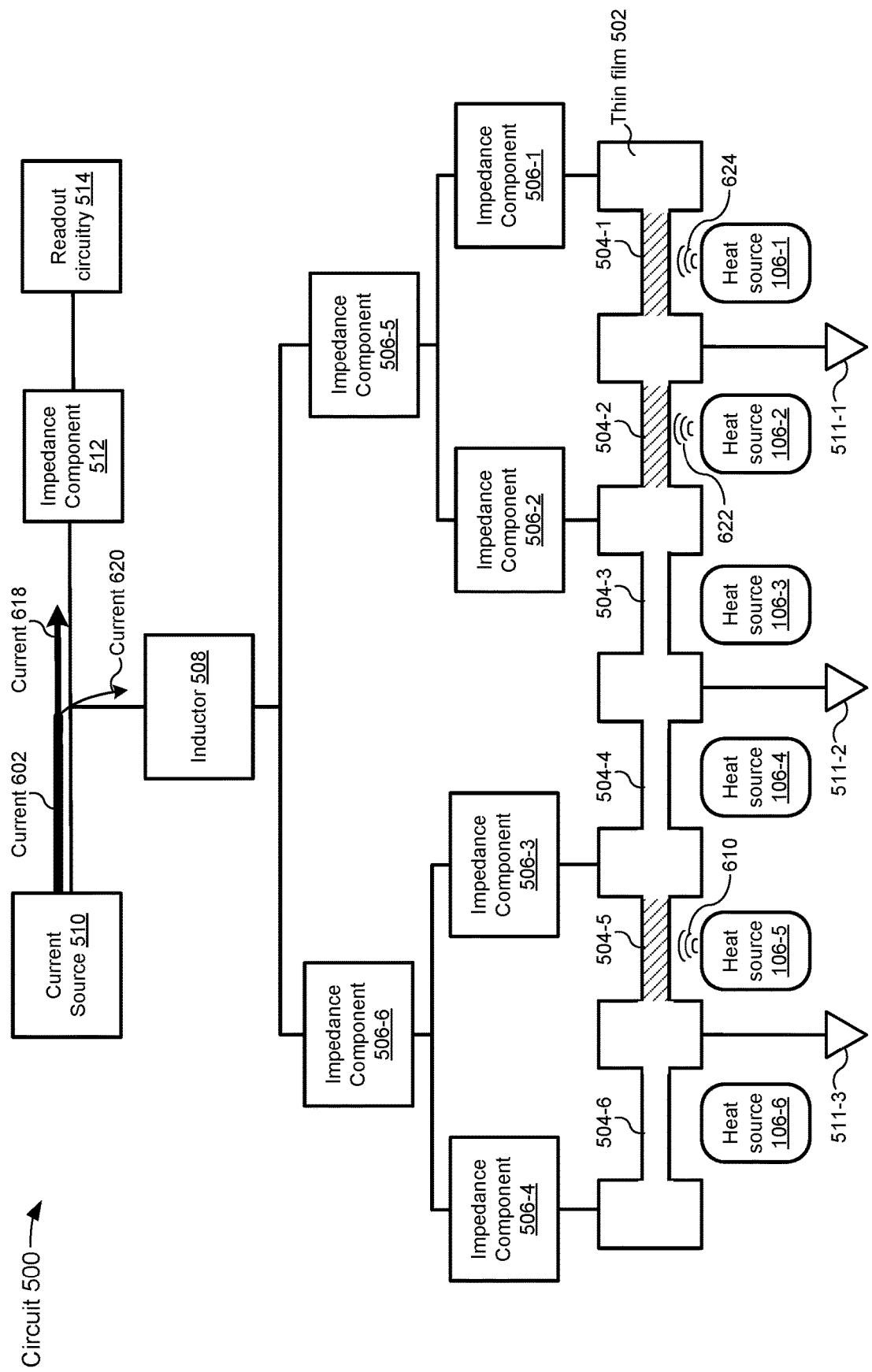

FIGS. 6A-6C are prophetic diagrams illustrating a representative operating sequence of the superconducting circuit 500 in accordance with some embodiments. In FIG. 6A, the current source 510 supplies a current 602 adapted such that each narrow portion 504 of the thin film 502 is operating in the superconducting state (e.g., the current 602 is less than a superconducting threshold current for each of the narrow portions 504). Since the thin film 502 has zero resistance while in the superconducting state, a majority of the current 402 flows through the thin film 502 rather than the impedance component 512 in FIG. 6A (e.g., the combined impedance of impedance components 506 is less than an impedance of the impedance component 512). In some embodiments, the current 602 is in the range of 10 milliamps to 100 milliamps.

In FIG. 6B the heat source 106-5 is actively transferring heat 610 to the corresponding narrow portion 504-5 of the thin film 502, for example in response to detection of a photon or in response to detection of a threshold number of photons incident on a corresponding photon detector (see discussion of FIG. 2C, above). The heat 610 lowers the superconducting current threshold of the narrow portion 504-5 such that the current 602 exceeds the lowered threshold. As a result of the current 602 exceeding the lowered threshold, the narrow portion 504-5 of the thin film 502 transitions from the superconducting state to the non-superconducting state. The narrow portion 504-5 has non-zero resistance while in the non-superconducting state. The non-zero resistance of the narrow portion 504-5 results in a portion 614 of the current from the current source 510 redirecting to the readout circuitry 514 via the impedance component 512, and a current 616, less than the current 602, flowing to the thin film 502. In the example of FIG. 6B, the amount of the current 614 indicates that one narrow portion is in the non-superconducting state.

In FIG. 6C the heat sources 106-1, 106-2, and 106-5 are actively transferring heat 624, 622, and 610, respectively, to the corresponding narrow portions 504-1, 504-2, and 504-5 of the thin film 502. The transferred heat 624, 622, and 610 lowers the superconducting current threshold of the corresponding narrow portions such that the current 602 exceeds the lowered threshold. As a result of the current 602 exceeding the lowered thresholds, the narrow portions 504-1, 504-2, and 504-5 of the thin film 502 transition from the superconducting state to the non-superconducting state. The non-zero impedance of the narrow portions 504-1, 504-2, and 504-5 result in a portion 618 of the current (greater than the portion 614 in FIG. 6B) from the current source 510 being redirected to the readout circuitry 514, and a current 620, less than the current 602, flowing to the thin film 502. In the example of FIG. 6C, the amount of the current 618 indicates that three narrow portions are in the non-superconducting state, and thus that three heat sources 106 (or photo detectors) have become active.

Figure 7:
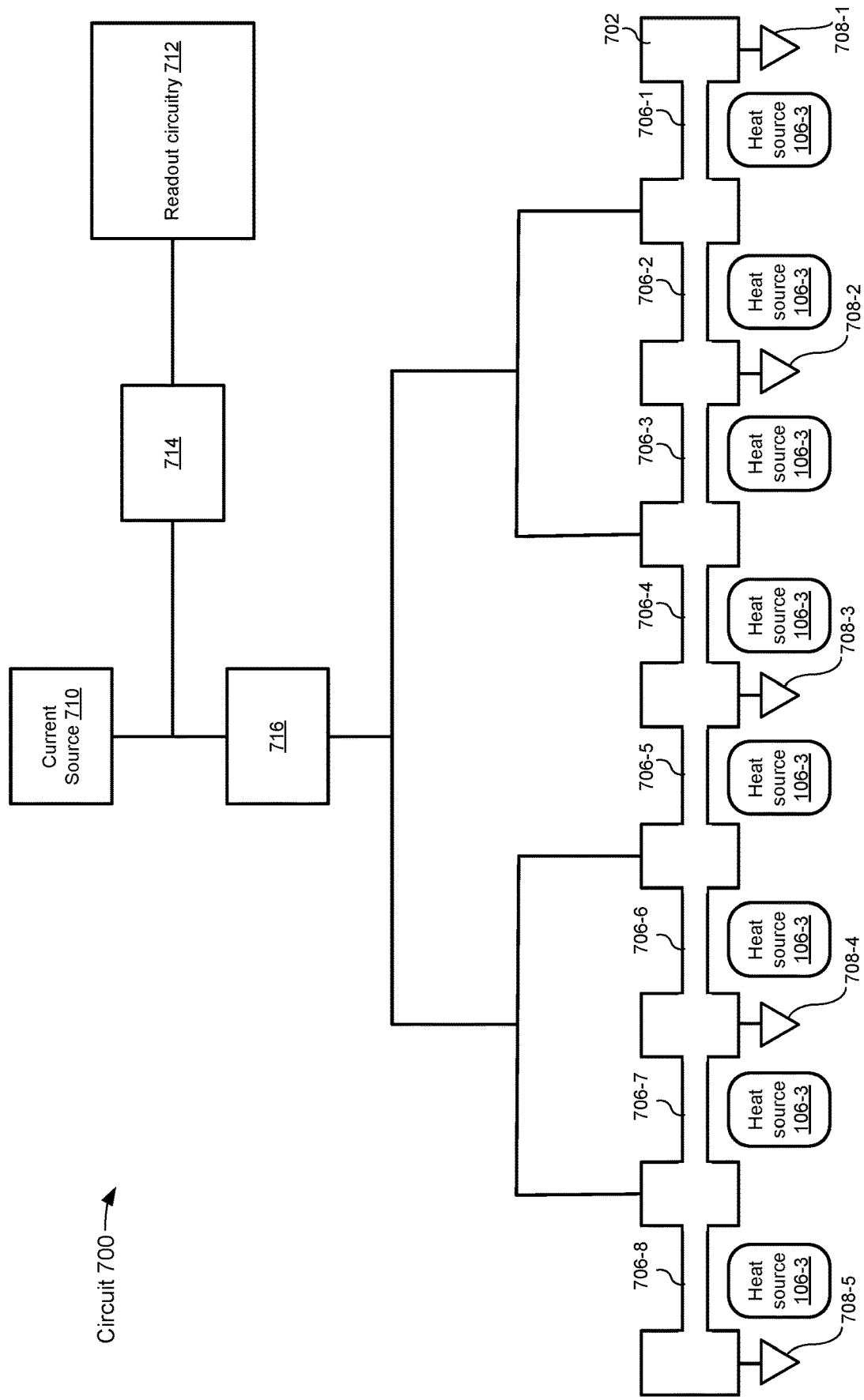
FIG. 7 is a schematic diagram illustrating a representative superconducting circuit in accordance with some embodiments.

FIG. 7 is a schematic diagram illustrating a superconducting circuit 700 in accordance with some embodiments. FIG. 7 shows a superconducting circuit 700 having a superconducting component 702 with alternating wide and narrow portions (e.g., narrow portions 706-1 through 706-8). In some embodiments, the superconducting component 702 is a thin film of superconducting material having alternating wide and narrow portions. FIG. 7 further shows heat sources 106 thermally coupled to, and electrically isolated from, the superconducting component 702.

In some embodiments, the superconducting component 702 and the heat sources 106 are patterned from a single thin film of superconducting material (e.g., composed of niobium). FIG. 7 further shows a current source 710 coupled to the superconducting component 702 via an impedance component 716 (e.g., an inductor). In accordance with some embodiments, the current source 710 is coupled to alternating wide portions of the superconducting component 702 (e.g., via respective terminals of those wide portions). The other wide portions of the superconducting component 702 are coupled (e.g., via respective terminals of those wide portions) to reference nodes 708 (e.g., an electrical ground) in accordance with some embodiments. FIG. 7 also shows readout circuitry 712 coupled to the superconducting component 702 via a coupling component 714 (e.g., comprising a capacitor, a resistor, an inductor, and/or other circuit components). In some embodiments, the readout circuitry 712 is configured to measure an amount of current received from the current source 710. In some embodiments, the readout circuitry 712 is configured to determine whether an amount of current received from the current source 710 exceeds a predetermined threshold.

In some embodiments, the circuit 700 operates in a first mode of operation as a logical AND gate (e.g., each heat source must be active to produce a logical '1' output at the readout circuitry 712). In some embodiments, the current source 710 is configured such that the circuit 700 operates as a logical AND gate. For example, the current supplied by the current source 710 is selected such that current redirected from one or more narrow portions 706 is insufficient to cause other narrow portions 706 to transition to the non-superconducting state.

In some embodiments, the circuit 700 operates in a second mode of operation as a logical OR gate (e.g., one or more active heat sources will produce a logical '1' output at the readout circuitry 712). In some embodiments, the current source 710 is configured such that the circuit 700 operates as a logical OR gate (e.g., the current source is configured to supply a current that is greater than the current supplied in the first mode of operation). For example, the current source is configured to supply a current such that current redirected from one or more narrow portions 706 (e.g., from any one of the narrow portions 706) is sufficient to cause other narrow portions 706 to transition to the non-superconducting state, for example, due to an increase in current directed to the other narrow portions 706 when one of those portions transitions to the non-superconducting state, which in turn causes those other narrow portions to transitions to the non-superconducting state, sometimes herein called a cascade effect.

In some embodiments, the circuit 700 is configured to operate in a third mode of operation (e.g., a logical majority-gate configuration). In the logical majority-gate configuration, the current needs to be redirected from a subset of the narrow portions (e.g., greater than 1 but less than all of the narrow portions) to cause the cascade effect, and thus heat must be supplied by a subset (e.g., at least a predefined number, where the predefined number is greater than 1 and less than the total number of narrow portions 706 in superconducting component 702) of the heat sources 106 to transition all of the narrow portions to the non-superconducting state. While each of the narrow portions of the superconducting component 702 is in the non-superconducting state, the current from the current source 710, or a substantial portion of that current, is redirected to the readout component 712 (e.g., producing a logical '1' output at the readout component). In some embodiments, the circuit 700 is set in the logical AND configuration, the logical OR configuration, or the one or more Majority-Gate configurations by adjusting an amount of current supplied to the superconducting component 702 by the current source 710. Additional details regarding the operation of circuit 700 are disclosed in U.S. Provisional Application No. 62/630,657, filed Feb. 14, 2018, entitled "Superconducting Logic Gate," which is incorporated by reference herein.

Figure 8:
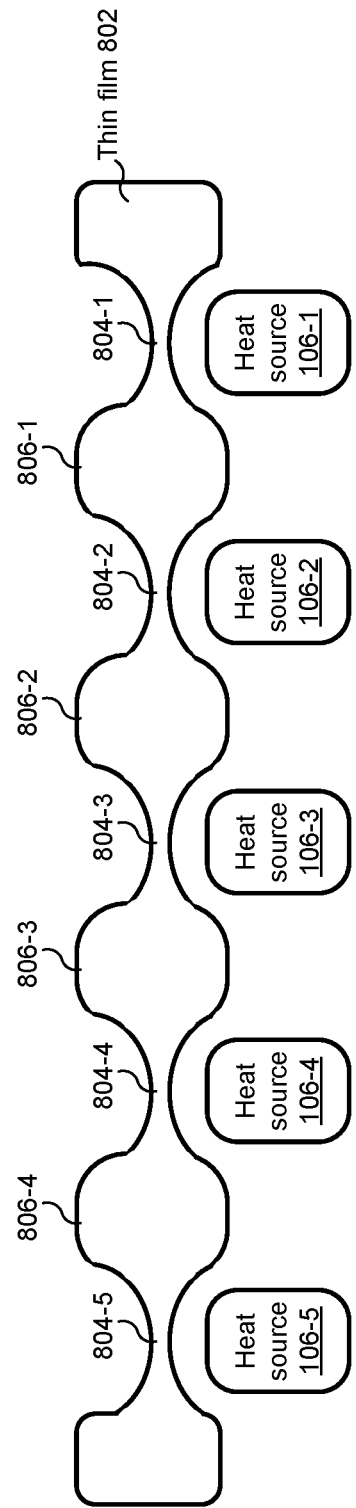
FIG. 8 illustrates a representative superconducting thin film in accordance with some embodiments.

Although FIGS. 1-7 show examples of superconductors having rectangular geometry, in some embodiments, the various superconductors described herein have other geometric (e.g., oval or circular) or non-geometric forms. FIG. 8 illustrates a superconducting thin film 802 having alternating wide portions 806 and narrow portions 804 with curved edges in accordance with some embodiments. The thin film 802 is similar to thin films 102 and 122, except that the wide portions 806 and narrow portions 804 have curved edges rather than the straight edges and corners as shown in FIGS. 1A and 1B. In some embodiments, the various circuits described herein utilize a thin film with curved edges, such as those of the thin film 802. Curved edges and rounded corners improve current flow in some circumstances by reducing current crowding at corners. Curved edges, such as those in FIG. 8, also reduce capacitive coupling between wide portions 806 (e.g., reduce cross-talk) in some circumstances compared to straight edges.

In light of these principles and embodiments, we now turn to certain additional embodiments.

In accordance with some embodiments, a superconducting component (e.g., superconducting component 100, FIG. 1A) includes: (1) a superconducting element (e.g., thin film 102) having a plurality of alternating narrow and wide portions, each wide portion having a corresponding terminal (e.g., terminals 108); and (2) a plurality of heat sources (e.g., heat sources 106), each heat source thermally coupled to a corresponding narrow portion such that heat from the heat source is transmitted to the corresponding narrow portion; where the plurality of heat sources is electrically isolated from the superconducting element. In some embodiments, the superconductor comprises a thin film of superconducting material (e.g., a thin film of niobium alloy). In some embodiments, two or more of the wide portions, but less than all, have a corresponding terminal.

In some embodiments, the superconducting component is configured such that, in response to the transmitted heat, the corresponding narrow portion transitions from a superconducting state to a non-superconducting state. For example, the narrow portion 304-2 in FIG. 4B transitioned from the superconducting state shown in FIG. 4A to the non-superconducting state (illustrated by the striped lines) in response to the heat 406 received from the heat source 106-2.

In some embodiments, each heat source comprises a superconductor. For example, FIG. 2A illustrates a heat source 200 including a superconductor 202 configured to generate heat in response to incident photon(s). In some embodiments, one or more of the heat sources comprise a semiconductor (e.g., a semiconductor configured to generate heat in response to receiving current from a current source). In some embodiments, one or more of the heat sources comprises a constant heat source configured to maintain the corresponding narrow portion in a non-superconducting state.

In some embodiments, a first heat source of the plurality of heat sources comprises a photon detector. For example, the first heat source comprises the heat source 200 described above with respect to FIGS. 2A-2D. As another example, the first heat source comprises a pump-gated superconducting photon detector.

In some embodiments, at least one terminal is coupled to a current source (e.g., the current source 308, FIG. 3A, or the current source 510, FIG. 5A) configured to supply a current such that one or more of the narrow portions are in a superconducting state. In some embodiments, at least one terminal is coupled to a reference node. For example, in the configuration illustrated in FIG. 5A a subset of the wide portions are coupled to reference nodes 511 via a plurality of terminals. In some embodiments, at least one terminal is coupled to a readout circuit (e.g., the readout circuitry 320, FIG. 3A, the readout circuitry 514, FIG. 5A, or the readout circuitry 712, FIG. 7).

In some embodiments, the superconducting component is configured to operate as a majority gate. For example, the circuit 700 in FIG. 7 illustrates a superconducting component 702 configured to operate as a majority gate in accordance with some embodiments.

In some embodiments, the superconducting component is configured to operate as a photon counter. For example, the circuit 300 in FIG. 3A and the circuit 500 in FIG. 5A illustrate superconducting components (e.g., thin films 302 and 502) configured to operate as photon counters (also sometimes called photon number resolution circuits).

In accordance with some embodiments, a photon detector system includes: (1) a first circuit that includes a plurality of superconducting components (e.g., the thin film 302, FIG. 3A); (2) a resistive component coupled in parallel with the first circuit (e.g., the resistor 306, FIG. 3A); (3) a plurality of heat sources (e.g., the heat sources 106, FIG. 3A), each heat source of the plurality of heat sources coupled to a corresponding superconducting component of the plurality of superconducting components and configured to selectively provide heat to the corresponding superconducting component in response to receiving light of at least a first intensity; (4) a current source (e.g., the current source 308, FIG. 3A) coupled to the plurality of superconducting components and the resistive component, and configured to supply a first current, where the first current is adapted to bias the first circuit such that: (a) responsive to the first current, a respective superconducting component of the first circuit operates in a superconducting state (e.g., illustrated in FIG. 4A); and (b) responsive to a combination of the first current and the heat from a corresponding heat source, the respective superconducting component operates in a non-superconducting state (e.g., narrow portion 304-2 illustrated in FIG. 4B); and (5) an output component (e.g., readout circuitry 320) coupled to the first circuit and configured to determine a number of the plurality of superconducting components in the non-superconducting state based on an impedance of the first circuit.

In some embodiments, the output component is configured to measure the impedance of the plurality of superconducting components. For example, the readout circuitry 320 is configured to measure an impedance of the thin film 302 in accordance with some embodiments.

In some embodiments, the output component is configured to measure a voltage drop across the resistive component. For example, the readout circuitry 320 is configured to measure a voltage drop across the resistor 306 in accordance with some embodiments.

In some embodiments, after transitioning to the non-superconducting state, superconducting components of the plurality of superconducting components are configured to maintain the non-superconducting state until a reset condition occurs. For example, the narrow portions of the thin film 302 are configured to stay in the non-superconducting state until the current source 308 ceases to supply current to the thin film 302.

In some embodiments, each heat source of the plurality of heat sources comprises a respective superconducting photonic detection component (e.g., the heat source 200 illustrated in FIG. 2A); where each respective superconducting photonic detection component is configured to transition from a superconducting state to a non-superconducting state in response to incident photons having at least the first intensity; and where the transition to the non-superconducting state generates heat that is transferred to the corresponding superconducting component.

In some embodiments, the first circuit further includes one or more inductive components configured to slow a transition of one or more superconducting components of the plurality of superconducting components from the non-superconducting state to the superconducting state.

In some embodiments, the first circuit includes a thin film of superconducting material (e.g., the thin film 302, FIG. 3A), the thin film having a plurality of alternating narrow and wide portions; and where the plurality of narrow portions comprises the plurality of superconducting components (e.g., narrow portions 304 in FIG. 3A comprise the superconducting components).

In some embodiments, the plurality of superconducting components and the plurality of heat sources are patterned from a single thin film. In some embodiments, the plurality of heat sources is electrically-isolated from the plurality of superconducting components. For example, the heat sources are positioned such that no current flows between the heat sources and the superconducting components and no electrons are transferred via quantum tunneling effects.

In some embodiments, the photon detection system includes a reference node (e.g., reference node 310, FIG. 3A) coupled to each of the plurality of superconducting components.

In some embodiments, the superconducting components of the plurality of superconducting components are arranged in series with one another. For example, the narrow portions 304 in FIG. 3A are arranged in series with respect to one another.

In accordance with some embodiments, a method for resolving a number of detected photons includes: (1) providing a first current to a first circuit (e.g., circuit 300, FIG. 3A) that includes: (a) a plurality of superconducting components (e.g., narrow portions 304 of thin film 302); and (b) a resistive component (e.g., the resistor 306) coupled in parallel with the plurality of superconducting components; where the first current is configured such that the plurality of superconducting components operates in a superconducting state; (2) providing heat to one or more of the plurality of superconducting components (e.g., the heat 406 provided to the narrow portion 304-2 in FIG. 4B), the heat configured to initiate a transition of the one or more superconducting components to a non-superconducting state; and (3) determining a number of the plurality of superconducting components in the non-superconducting state based on an impedance of the plurality of superconducting components (e.g., determining a number of components in the non-superconducting state based on an impedance of the thin film 302).

In some embodiments: (1) the heat is provided by one or more detector components (e.g., heat sources 106, FIG. 3A) responsive to one or more incident photons; where each detector component is coupled to a corresponding one of the plurality of superconducting components; and (2) the method further includes determining a number of incident photons based on the determined impedance. For example, determining a number of incident photons by associating the determined impedance with a number of active heat sources and associating an active heat source with a number of incident photons.

In accordance with some embodiments, a photon detector system includes: (1) a first circuit (e.g., the circuit 500, FIG. 5A) that includes: (a) a plurality of superconducting components (e.g., the narrow portions 504 of the thin film 502); and (b) a plurality of impedance components (e.g., the impedance components 506) coupling the plurality of superconducting components, where the plurality of impedance components comprises one or more inductors and/or one or more resistors; (2) a plurality of heat sources (e.g., the heat sources 106), each heat source of the plurality of heat sources coupled to a corresponding superconducting component of the plurality of superconducting components and configured to selectively provide heat to the corresponding superconducting component in response to receiving light of at least a first intensity; (3) a current source (e.g., the current source 510) coupled to the plurality of superconducting components via the plurality of impedance components and configured to supply a first current, where the first current is adapted to bias the first circuit such that: (i) responsive to the first current, a respective superconducting component of the first circuit operates in a superconducting state (e.g., as illustrated in FIG. 6A); and (ii) responsive to a combination of the first current and the heat from a corresponding heat source, the respective superconducting component operates in a non-superconducting state (e.g., narrow portion 504-5 as illustrated in FIG. 6B); and (4) an output component (e.g., readout circuitry 514) coupled in parallel with the first circuit, the output component configured to determine a number of the plurality of superconducting components in the non-superconducting state based on a portion of the first current flowing to the output component.

In some embodiments, each heat source of the plurality of heat sources comprises a respective superconducting photonic detection component (e.g., a pump-gated superconducting photon detector); where each respective superconducting photonic detection component is configured to transition from a superconducting state to a non-superconducting state in response to incident photons having at least the first intensity (e.g., as described above with respect to FIGS. 2A-2D); and where the transition to the non-superconducting state generates heat that is transferred to the corresponding superconducting component.

In some embodiments, the photon detector system further includes a first resistive component (e.g., the impedance component 512, FIG. 5A) coupling the output component to the current source; where the first resistive component and the plurality of impedance components are configured such that, in response to a superconducting component of the plurality of superconducting components transitioning to the non-superconducting state, a portion of the first current is redirected to the output component. For example, in FIG. 6B the heat source 106-5 supplies heat 610 to the narrow portion 504-5 and the narrow portion 504-5 transitions to the non-superconducting state. In this example, a portion 614 of the current 602 supplied by the current source 510 is redirected to the readout circuitry 514.

In some embodiments, the first circuit further includes one or more inductive components (e.g., the inductor 508, FIG. 5A) configured to slow a transition of one or more superconducting components of the plurality of superconducting components from the non-superconducting state to the superconducting state.

In some embodiments, the first circuit includes a thin film of superconducting material (e.g., the thin film 502, FIG. 5A), the thin film having a plurality of alternating narrow and wide portions; where the plurality of narrow portions comprises the plurality of superconducting components (e.g., the narrow portions 504 of the thin film 502). In some embodiments, the plurality of superconducting components and the plurality of heat sources are patterned from a single thin film.

In some embodiments, the plurality of heat sources is electrically-isolated from the plurality of superconducting components.

In some embodiments, the photon detector system further includes a reference node coupled to each of the plurality of superconducting components (e.g., the reference nodes 511 in FIG. 5A).

In some embodiments, the superconducting components of the plurality of superconducting components are arranged in parallel with one another. In some embodiments, the reference nodes are coupled to the plurality of superconducting components such that the superconducting components are in a parallel arrangement with one another.

In some embodiments, the portion of the first current flowing to the output component corresponds to the number of the plurality of superconducting components in the non-superconducting state. In some embodiments, the portion of the first current flowing to the output component is proportional to the number of the plurality of superconducting components in the non-superconducting state. In some embodiments, the portion of the first current flowing to the output component nearly proportional to the number of the plurality of superconducting components in the non-superconducting state (e.g., within 10% of a linear correspondence).

In accordance with some embodiments, a method for resolving a number of incident photons, includes: (1) providing a first current to a first circuit (e.g., circuit 500, FIG. 5A) that includes: (a) a plurality of superconducting components (e.g., the narrow portions 504 of thin film 502); (b) an output component (e.g., the readout circuitry 514); and (c) a plurality of impedance components (e.g., the impedance components 506) coupling the plurality of superconducting components and the output component; where the first current is configured such that the plurality of superconducting components operates in a superconducting state; (2) providing heat to one or more of the plurality of superconducting components (e.g., the heat 610, 622, and 624 provided to the narrow portions 504-5, 504-2, and 504-1 in FIG. 6C), the heat configured to initiate a transition of the one or more superconducting components to a non-superconducting state; and (3) detecting a portion of the first current at the output component, the portion of the first current proportional to a number of superconducting components in the non-superconducting state (e.g., determining a number of narrow portions in the non-superconducting state based on the current received at the readout circuitry 514 in FIG. 6C).

In some embodiments: (1) the heat is provided by one or more detector components (e.g., heat sources 106, FIG. 5A) responsive to one or more incident photons; where each detector component is coupled to a corresponding one of the plurality of superconducting components; and (2) the method further includes determining a number of incident photons based on the portion of the first current. For example, determining a number of incident photons by associating the determined portion of the first current with a number of active heat sources and associating an active heat source with a number of incident photons.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A circuit component, comprising:
    a first circuit, including:
        a superconductor having a plurality of alternating narrow and wide portions, including a plurality of narrow portions each having a first width and opposing ends connected to respective wide portions, and a plurality of wide portions each having a second width greater than the first width, two or more of the wide portions each having a corresponding terminal; and
        a plurality of heat sources, each heat source thermally coupled to a corresponding narrow portion such that heat from the heat source is transmitted to the corresponding narrow portion; and
    an output component coupled to the first circuit, the output component configured to determine a number of the plurality of narrow portions of the superconductor in a non-superconducting state.

2. The circuit component of claim 1, wherein a first heat source of the plurality of heat sources comprises a photon detector.

3. The circuit component of claim 1, wherein the circuit component is configured to operate as a photon counter.

4. The circuit component of claim 1, wherein the superconductor comprises a thin film of superconducting material.

5. The circuit component of claim 1, wherein the circuit component is configured such that, in response to the transmitted heat, a corresponding narrow portion transitions from a superconducting state to a non-superconducting state.

6. The circuit component of claim 5, wherein wide portions connected to the corresponding narrow portion are configured to remain in a superconducting state while the corresponding narrow portion transitions from the superconducting state to the non-superconducting state.

7. The circuit component of claim 5, where the wide portions are configured to thermally isolate the narrow portions from one another so that heat coupled to a respective narrow portion by a corresponding heat source is not sufficient to cause a neighboring narrow portion to transition from a superconducting state to a non-superconducting state.

8. The circuit component of claim 1, wherein each heat source comprises a superconductor.

9. The circuit component of claim 1, wherein at least one terminal is coupled to a current source configured to supply a current such that a respective narrow portion of the superconductor is in a superconducting state prior to a corresponding heat source of the plurality of heat sources transmitting heat to the respective narrow portion.

10. The circuit component of claim 1, wherein at least one terminal is coupled to a reference node.

11. The circuit component of claim 1, wherein the output component is coupled to the first circuit via at least one terminal.

* * * * *